(12) United States Patent
Fukuda et al.

(10) Patent No.: US 7,712,475 B2
(45) Date of Patent: May 11, 2010

(54) CLEANING APPARATUS, COATING AND DEVELOPING APPARATUS, AND CLEANING METHOD

(75) Inventors: Masahiro Fukuda, Koshi (JP); Taro Yamamoto, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 1087 days.

(21) Appl. No.: 11/345,529

(22) Filed: Feb. 2, 2006

(65) Prior Publication Data

US 2007/0012339 A1 Jan. 18, 2007

(30) Foreign Application Priority Data

Feb. 3, 2005 (JP) ............................. 2005-028241

(51) Int. Cl.
B08B 3/04 (2006.01)
B05C 5/00 (2006.01)
B05C 5/02 (2006.01)
B05C 3/02 (2006.01)

(52) U.S. Cl. ...................... 134/94.1; 134/56 R; 118/70; 118/75

(58) Field of Classification Search ................ 134/94.1, 134/95.1; 118/70, 75
See application file for complete search history.

(56) References Cited

U.S. PATENT DOCUMENTS 5,882,433 A * 3/1999 Ueno ........................... 134/31

| 6,357,457 | B1* | 3/2002 | Taniyama et al. | ......... 134/57 R |
| 7,145,643 | B2* | 12/2006 | Auer-Jongepier et al. | ..... 355/72 |
| 2002/0182040 | A1* | 12/2002 | Kimura et al. | ......... 414/331.04 |
| 2003/0202792 | A1* | 10/2003 | Goshi | ......................... 396/564 |
| 2005/0026448 | A1* | 2/2005 | Engesser | .................... 438/717 |
| 2007/0047388 | A1* | 3/2007 | DeNatale et al. | ............ 366/341 |

FOREIGN PATENT DOCUMENTS

| JP | 5-291223 | 11/1993 |
| JP | 9-69488 | 3/1997 |
| JP | 2000-49135 | 2/2000 |

* cited by examiner

*Primary Examiner*—Michael Barr
*Assistant Examiner*—Natasha Campbell
(74) *Attorney, Agent, or Firm*—Oblon, Spivak, McClelland, Maier & Neustadt, L.L.P.

(57) ABSTRACT

A wafer W is held in a horizontal attitude within an airtight container 41 by a vacuum chuck 42 such that small gaps are formed between the wafer W and the inner surfaces of the airtight container 41. A cleaning liquid is supplied toward the center portion of a front surface of the wafer W through a fluid supply port 40 which is an end of a fluid supply path 5, and is discharged through a fluid discharge portion 44 arranged in the bottom portion of the airtight container 41 in a form of a groove running along a circle having its center located on the center axis of the wafer W. The cleaning liquid flows and spreads from the center portion of the wafer W toward the peripheral portion while removing particles adhered to the wafer W, and is discharged through the fluid discharge portion 44.

This arrangement allows the particles to be uniformly and reliably removed without rotating the wafer W. The entire cleaning apparatus 4 has a small size.

18 Claims, 16 Drawing Sheets

CLEANING APPARATUS, COATING AND DEVELOPING APPARATUS, AND CLEANING METHOD

TECHNICAL FIELD OF THE INVENTION

The present invention relates to a cleaning technique for a substrate, and more particularly to a cleaning technique suitable for cleaning a circular substrate, such as a semiconductor wafer, that has been subjected to an immersion exposure process after being coated with a resist liquid.

BACKGROUND ART

In manufacturing of a semiconductor device or an LCD substrate, a technique called "photolithography" is used to form a resist pattern on a substrate. Photolithography refers to a technique that coats a semiconductor wafer (hereinafter referred to simply as a "wafer") with a resist liquid, exposes the resist in a predetermined pattern, and then develops the resist, thereby to form a desired resist pattern. Such a process is generally performed in a system made up of a coating-and-developing apparatus for coating and developing a resist liquid and an exposure apparatus connected to the coating-and-developing apparatus.

In recent years, there has been an increasing tendency to reduce the size and film thickness of device patterns. Accordingly, the demand for enhanced exposure resolution is increasing. To meet this demand, a technique is proposed to improve the conventional exposure method that uses argon fluoride (ArF) or krypton fluoride (KrF). This technique exposes a substrate after forming a light-transmissive liquid layer (e.g., a deionized water film) on its surface (which is hereinafter referred to as 'immersion exposure'). This immersion exposure technique utilizes the fact that the wavelength of light decreases in water; ArF (light) actually has a wavelength of 134 nm in water though its normal wavelength is 193 nm.

An immersion exposure apparatus will now be briefly described with reference to FIG. 21. A wafer W is held in a horizontal attitude by a retention mechanism (not shown). An exposure means 1 is disposed above the wafer W such that the exposure means 1 faces the wafer W across a gap. A lens 10 is provided in the center portion of the leading end of the exposure means 1. Outside the lens 10 are provided a supply port 11 for supplying deionized water to the surface of the wafer W and a suction port 12 for sucking and thereby retrieving the supplied deionized water. The deionized water continuously supplied through the supply port 11 is continuously retrieved through the suction port 12, thereby forming a liquid film (or a deionized water film) between the lens 10 and the surface of the wafer 10. The wafer W is irradiated through the lens 10 and the liquid film with light emitted from a light source (not shown) to imprint a predetermined circuit pattern in a resist R.

Upon completion of the exposure of one imprint region (or shot region) 13, the exposure means 1 is moved in a horizontal direction to align with and expose the next imprint region 13 while maintaining the liquid film between the lens 10 and the surface of the wafer W, as shown in FIG. 22. This process is repeated to imprint a predetermined circuit pattern in the surface of the wafer W. It should be noted that in FIG. 22 each shot region 13 is shown larger than actual size.

The above immersion exposure technique has a problem in that the resist might be dissolved into the liquid film and the dissolved components, for example, PAG (acid generator) or a quencher, may remain on the wafer W. Although a process for removing the liquid on the surface of the wafer W is performed after the exposure process, the liquid may possibly be left on the surface. Especially, since the peripheral edge portion of the wafer W has a beveled shape, there is the possibility that a liquid containing the above dissolved components may remain on the beveled surface of the peripheral edge portion of the wafer W.

If liquid containing the above dissolved components remains on the wafer W, the dissolved components adhere to the wafer W and may cause generation of particles, resulting in defects in the resist pattern and hence in the device. Furthermore, these particles may adhere to the wafer transfer arms installed in the coating-and-developing apparatus and, as a result, may be scattered in processing units or transferred to another wafers, thus causing "particle contamination".

When particles originating from the dissolved components are attached to the wafer W, these particles are fixedly or firmly adhered to the wafer during the heat treatment performed after the exposure process, affecting the line width of the pattern. Furthermore, the particles adhered to the wafer W may damage the pattern during the developing process.

Efforts have been made to develop a new resist liquid insoluble in the liquid film formed during the immersion exposure process. Further, it has been proposed that a water-shedding protective film may be coated onto the resist film in order to reduce the dissolution of the resist into the liquid film and to prevent the liquid used in the immersion exposure process from remaining on the surface of the wafer W. However, it is very difficult to create such a new resist liquid. Further, adding a protective film forming step results in the increase in the total number of processes and hence in cost.

In view of the above, a practical method for removing the particles originating from the resolved resist liquid components is to clean the surfaces and the peripheral portion of the wafer W after the immersion exposure process. The so-called spin cleaning apparatus is generally used as a unit for cleaning the wafer W. This apparatus rotates the wafer W while supplying a cleaning liquid to the center portion of the wafer W, and thereafter performs spin-drying. This unit is incorporated in the coating-and-developing apparatus.

However, such a cleaning apparatus requires a spin chuck for rotating the wafer W and a large cup for recovering the cleaning liquid scattered from the wafer W. This means that the entire cleaning apparatus has a large size and a complicated structure. Furthermore, if the cleaning apparatus is provided with a suction device ensuring that the cup assuredly captures the scattered cleaning liquid, the size of the cleaning apparatus becomes larger.

JP5-291223A discloses a cleaning apparatus that has neither a rotating mechanism nor a cup member for recovering the cleaning liquid. This cleaning apparatus includes a cleaning chamber and a buffer tank each including a heat exchanger with heating and cooling capabilities. A cleaning liquid is supplied from the buffer tank to the cleaning chamber through a substantially center portion of the cleaning chamber to clean the wafer W, and the supplied cleaning liquid is discharged through the discharge port provided in the lower center portion of the cleaning chamber and returned to the buffer tank.

In the cleaning apparatus disclosed in JP5-291223A, the cleaning liquid is sprayed onto the center portion of the wafer W to clean the surface of the wafer W. The cleaning liquid that has dropped from the surface of the wafer W flows into the discharge port and is trapped in the buffer tank. However, it is difficult for this cleaning apparatus to uniformly spray a cleaning liquid over the entire surface of the wafer W and thereby to reliably clean both the surface and the peripheral portion of the wafer W. Therefore, this cleaning apparatus is not suitable for the cleaning performed after the immersion exposure process.

DISCLOSURE OF THE INVENTION

The present invention has been devised in view of the above circumstances. It is, therefore, an object of the present invention to provide a technique for cleaning a substrate that achieves uniform and reliable removal of particles originating from the dissolved resist components attached to the surface and the peripheral portion of the substrate, with the use of an apparatus having a simple structure.

Another object of the present invention is to provide a technique that achieves reducing the size of the coating-and-developing apparatus while meeting the demand for removal of the particles attached to the surface and the peripheral portion of the substrate.

In order to achieve the above objectives, the present invention provides a cleaning apparatus including: a substrate holding unit for holding a circular substrate in a horizontal attitude; an airtight container for accommodating the substrate such that a gap is formed between the airtight container and a front surface of the substrate held by the substrate holding unit and a gap is formed between the airtight container and at least a peripheral portion of a back surface of the substrate held by the substrate holding unit; a first cleaning liquid supply path, opening into an interior of the airtight container to face a center portion of the front surface of the substrate held by the substrate holding unit, for supplying a cleaning liquid toward the center portion of the front surface of the substrate; a dry gas supply path through which a dry gas is supplied to the substrate held by the substrate holding unit after the substrate is supplied with the cleaning liquid; and a fluid discharge path, opening into the interior of the airtight container along a circle having its center located on an center axis of the substrate held by the substrate holding unit, for discharging the cleaning liquid from the airtight container, whereby the cleaning liquid supplied through the first cleaning liquid supply path into the airtight container flows and spreads from the center portion of the substrate to the peripheral portion of the substrate and exits through the fluid discharge path while the gaps between the airtight container and the surfaces of the substrate is filled up with the cleaning liquid.

In one preferred embodiment, the fluid discharge path opens, at a bottom portion of the airtight container, into the interior of the airtight container along a circle having its center located on a center axis of the substrate held by the substrate holding unit. In this case, preferably, the fluid discharge path opens into the interior of the airtight container near the substrate holding unit.

In another preferred embodiment, the cleaning apparatus further includes a second cleaning liquid supply path, opening into the interior of the airtight container to face the back surface of the substrate, for supplying a cleaning liquid toward the back surface of the substrate held by the substrate holding unit, wherein the fluid discharge path opens into the interior of the airtight container such that an opening or openings of the fluid discharge path surround a peripheral edge of the substrate held by the substrate holding unit. In this case, the cleaning liquid supplied through the first cleaning liquid supply path into the airtight container flows and spreads toward the peripheral portion of the substrate and exits the airtight container through the fluid discharge path while the gap between the front surface of the substrate and the airtight container is filled up with the cleaning liquid; and the cleaning liquid supplied through the second cleaning liquid supply path into the airtight container flows and spreads toward the peripheral portion of the substrate and exits the airtight container through the fluid discharge path while the gap between the back surface of the substrate and the airtight container is filled up with the cleaning liquid.

The substrate holding unit may be a ring-shaped vacuum chuck that holds the substrate by suction while the substrate holding unit is in contact with a center portion of the back surface of the substrate. A path used as the first cleaning liquid supply path may be also used as the dry gas supply path. A path used as the fluid discharge path may be also used as the discharge path for discharging the dry gas. The cleaning apparatus may be used as a cleaning apparatus that cleans the surfaces and the peripheral portion of the substrate which has been has been subjected to an exposure process after coated with a resist liquid. The exposure process may be an immersion exposure process.

Hydrophilic regions having been subjected to a hydrophilizing treatment and hydrophobic regions having been subjected to a hydrophobizing treatment may be formed on an inner surface of the airtight container such that the hydrophilic regions and the hydrophobic regions are formed along concentric circles having their common center located on an center axis of the substrate held by the substrate holding unit, and are arranged alternately with respect to a radial direction of the substrate. Alternatively, the airtight container is formed such that a gap between the airtight container and a surface of the substrate held by the substrate holding unit gradually decrease as location of measurement of the gap goes from the center portion of the substrate toward the peripheral portion of the substrate. A plurality of recesses may be formed in a surface, facing a surface of the substrate held by the substrate holding unit, of the airtight container, and the recesses are arranged along concentric circles having their common center located on located on an center axis of the substrate held by the substrate holding unit. The fluid discharge path may be provided in its midway thereof with a buffer chamber to equalize fluid discharge rate distribution with respect to a circumferential direction of the substrate. The airtight container may be formed such that a gap between the airtight container and a surface of the substrate held by the substrate holding unit at a peripheral portion of the substrate is smaller than that at a center portion of the substrate. The airtight container may be formed such that a gap between the airtight container and a surface of the substrate held by the substrate holding unit suddenly decreases at a predetermined position in the peripheral portion of the substrate and then increases at a position outside the predetermined position.

The cleaning apparatus may further include: a cleaning liquid flow rate adjusting unit provided in the first cleaning liquid supply path; a dry gas flow rate adjusting unit provided in the dry gas supply path; and a control unit configured to control the cleaning liquid flow rate adjusting unit and the dry gas flow rate adjusting unit such that: a cleaning liquid is supplied to the airtight container through the first cleaning liquid supply path at a first cleaning liquid flow rate; thereafter the cleaning liquid is supplied to the airtight container at a second cleaning liquid flow rate higher than the first cleaning liquid flow rate; thereafter, in place of the cleaning liquid, a dry gas is supplied to the airtight container through the dry gas supply path at a first dry gas flow rate; and thereafter the dry gas is supplied to the airtight container at a second dry gas flow rate higher than the first dry gas flow rate.

The cleaning apparatus may further include a supplementary cleaning liquid supply portion for supplying a cleaning liquid to at least one of a peripheral portion of the front surface of the substrate held by the substrate holding unit and a peripheral portion the back surface of the substrate held by the substrate holding unit, wherein the supplementary cleaning liquid supply portion is arranged along a circle having its center located on a center axis of the substrate held by the substrate holding unit. The cleaning apparatus may be configured such that a gap between the airtight container and a surface of the substrate held by the substrate holding unit can be changed.

Preferably, the gaps between the airtight container and the substrate held by the substrate holding unit are not less than 1 mm but not more than 5 mm.

The cleaning apparatus may be incorporated into a coating-and-developing apparatus including a carrier mounting section, a processing section, and an interface section connectable to an exposure apparatus, wherein the coating-and-developing apparatus is configured to: transfer a substrate, carried into the carrier mounting section by use of a carrier, to the processing apparatus; form a resist film on the substrate in the processing section; transfer the substrate to the exposure apparatus through the interface section; develop the substrate, which has been exposed and returned to the processing section through interface section, in the processing section; and transfer the substrate to the carrier mounting section.

The present invention further provides a method for cleaning a substrate that has been exposed after being coated with a resist liquid. The method includes the steps of: supplying a cleaning liquid toward a center portion of a front surface of a substrate, which is held in an airtight container with gaps being formed between the airtight container and the substrate so that the cleaning liquid flows from a center portion of the substrate toward a peripheral portion of the substrate while the gaps between the airtight container and surfaces of the substrate are filled up with the cleaning liquid; and discharging the cleaning liquid from the airtight container through a fluid discharge path opening at a bottom portion of the airtight container into the interior of the airtight container along a circle having its center located on an center axis of the substrate; and thereafter supplying, in place of the cleaning liquid, a dry gas toward the substrate so that the dry gas flows toward the peripheral portion of the substrate while the gaps are filled between the airtight container and the surfaces of the substrate are filled up with the dry gas, and that the dry gas is discharged through the fluid discharge path.

The present invention still further provides a method for cleaning a substrate that has been exposed after being coated with a resist liquid. The method includes the steps of: supplying a cleaning liquid toward a center portion of a front surface of a substrate and toward a back surface of the substrate, which is held in an airtight container with gaps being formed between the airtight container and the substrate so that the cleaning liquid flows from toward a peripheral portion of the substrate while the gaps between the airtight container and the substrate are filled up with the cleaning liquid; and discharging the cleaning liquid from the airtight container through a fluid discharge path opening into the interior of the airtight container such that an opening or openings of the fluid discharge path surround a peripheral edge of the substrate; and thereafter supplying, in place of the cleaning liquid, a dry gas toward the substrate so that the dry gas flows toward the peripheral portion of the substrate while the gaps are filled up with the dry gas, and that the dry gas is discharged through the fluid discharge path.

DESCRIPTION OF REFERENCE SIGNS

Figure 1:
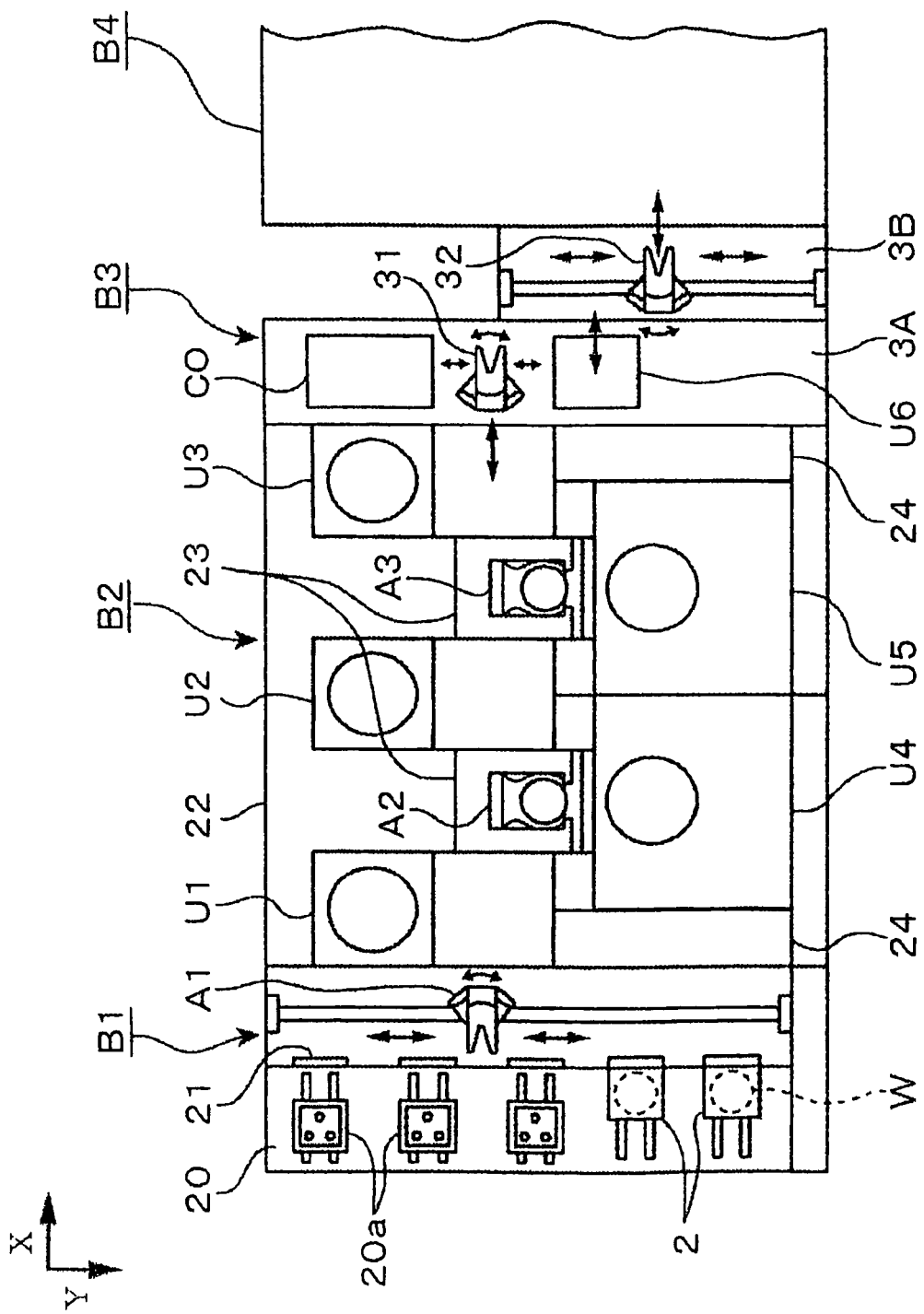
FIG. 1 is a schematic plan view of a coating-and-developing apparatus according to an embodiment of the present invention.

W . . . Semiconductor wafer
2 . . . Carrier
4 . . . Cleaning apparatus
8, 41 . . . Airtight container 41a . . . Container body
41b . . . Cover
42 . . . Vacuum chuck (Substrate holding unit)
44 . . . Fluid discharge portion
5 . . . Fluid supply path
51 . . . Cleaning liquid supply path
52 . . . Dry gas supply path

DESCRIPTION OF PREFERRED
EMBODIMENTS

Figure 2:
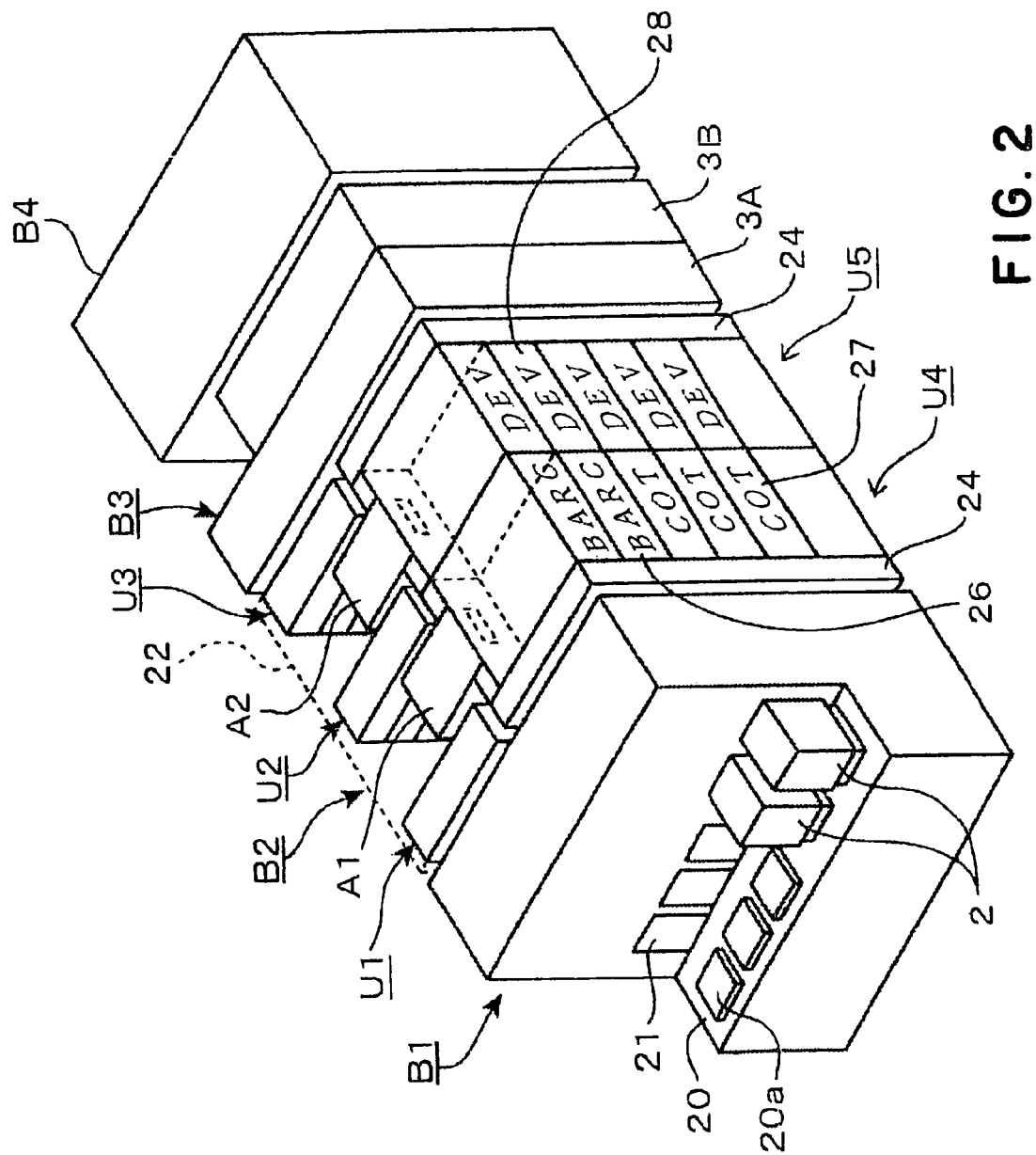
FIG. 2 is a schematic perspective view of the coating-and-developing apparatus shown in FIG. 1.
Figure 3:
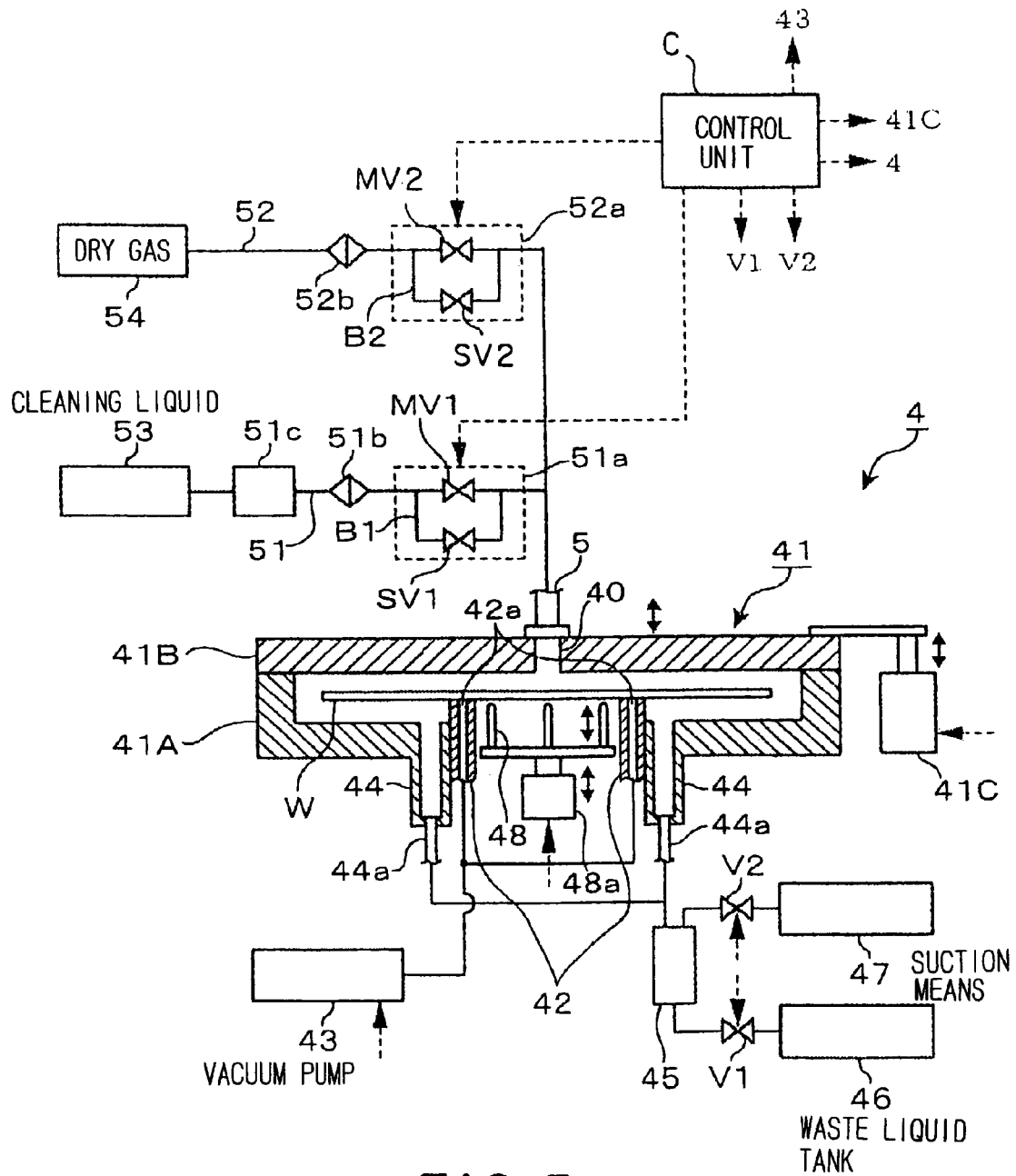
FIG. 3 shows a cross-sectional view of the structure of a cleaning apparatus incorporated in the coating-and-developing apparatus shown in FIG. 1, as well as showing the plumbing connected to the cleaning apparatus.
Figure 4:
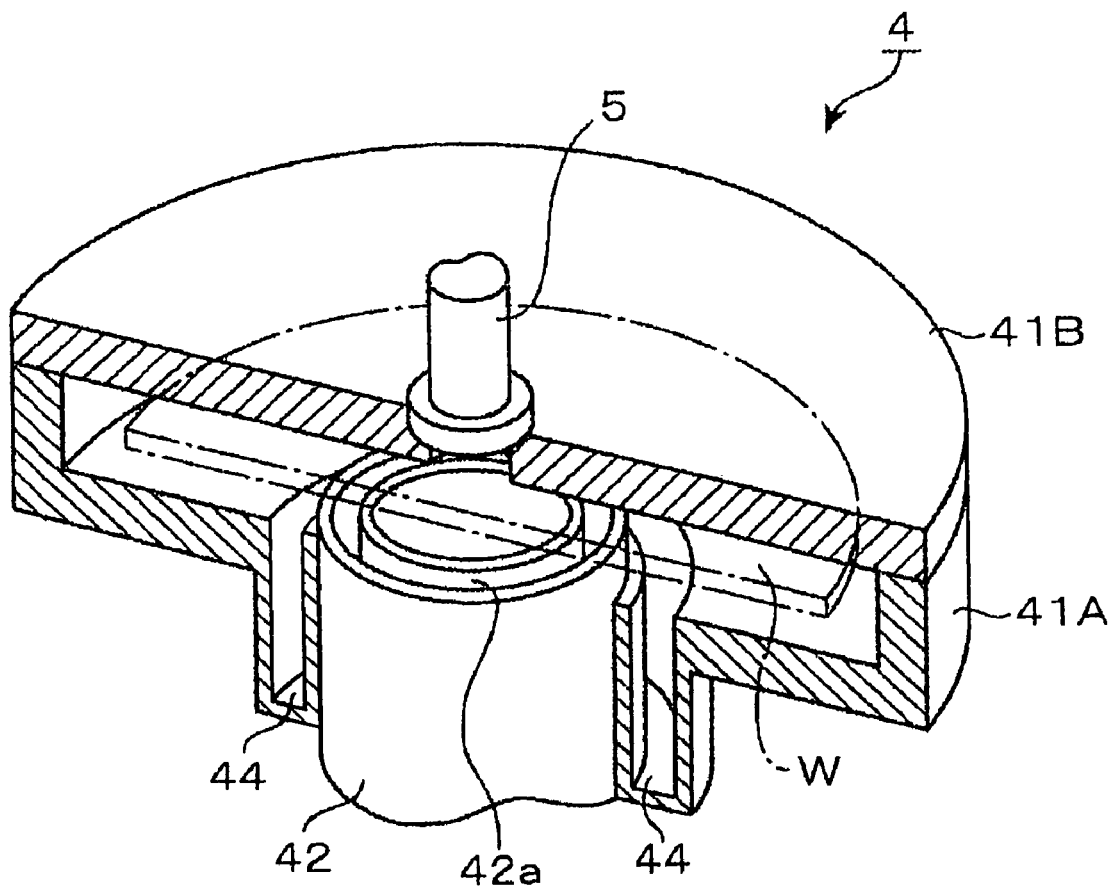
FIG. 4 is a partial cutaway perspective view schematically showing the structure of the cleaning apparatus shown in FIG. 4.

With reference to FIGS. 1 and 2, there will now be briefly described the overall configuration of a resist pattern forming system made up of a coating-and-developing apparatus, in which a cleaning apparatus according to the present invention is incorporated, and an exposure apparatus connected to the coating-and-developing apparatus. For simplicity of explanation, in FIG. 1, positive X-direction is referred to "front"; the negative X-direction is referred to "rear"; the positive Y-direction is referred to "right"; and the negative Y-direction is referred to "left", hereinafter. In FIGS. 1 and 2, reference numeral B1 denotes a carrier mounting section through which carriers 2 are transferred to and from the coating-and-developing apparatus, each carrier 2 containing a plurality of substrates (e.g., wafers W), for example, 13 substrates and being hermetically closed. The carrier mounting section B1 includes: a carrier station 20 having stages 20a on which a plurality of carriers 2 can be arrayed; openings 21 which are provided in the wall surface in front of the carrier station 20 and are opened and closed by respective shutters (not shown); and a transfer means (or wafer transfer arm) A1 for removing wafers W from the carriers 2 through the openings 21.

A processing section B2 enclosed by an enclosure 22 is connected to the front side of the carrier mounting section B1. Arranged on the left side of the processing section B2 are unit racks U1, U2, and U3 including plural heating units and cooling units stacked on one another. Arranged on the right side of the processing section B2 are unit racks U4 and U5 each including plural liquid processing units stacked on one another. Further, the processing section B2 is provided therein with main transfer means (or main transfer arms) A2 and A3 for transferring wafers W between the units on the unit racks U1 to U5. The unit racks U1 to U5 and the main transfer means A2 and A3 are arranged in a row in the front-and-rear direction. Each processing unit of each unit rack has an access portion for the main transfer means A2 and A3, which portion has an opening through which wafers are transferred. Therefore, the wafers W are freely transferred between arbitrary units within the processing section B2.

The main transfer means A2 and A3 are installed within the spaces enclosed by partition walls 23 that include front and rear surfaces of the unit racks U1, U2, and U3, the left surfaces of the unit racks U4 and U5, and surfaces provided on the left side of the main transfer means. In FIGS. 1 and 2, reference numeral 24 denotes temperature-and-humidity control unit including: a device for adjusting the temperatures of the processing liquids used in each liquid processing unit; and a duct for adjusting the temperature and the humidity in the processing section B2.

The unit racks U1, U2, and U3 are each made up of plural (e.g., 10) various units, stacked on one another, that perform pre-treatments and post-treatments for the liquid processing performed by the liquid processing units in the unit racks U4 and U5. The unit racks U1, U2, and U3 each accommodate processing units such as: a transfer unit; a hydrophobizing treatment unit (ADH); a temperature control unit (CPL) for adjusting the temperature of a wafer W to a predetermined value; a heating unit (BAKE) for heating the wafer W before coating it with a resist liquid; a heating unit (PAB) for heating the wafer W after coating it with the resist liquid referred to as a "pre-baking unit"; a heating unit (POST) for heating the wafer W after the developing process referred to as a "post-baking unit".

The unit racks U4 and U5 are each made up of plural (e.g., 5) liquid processing units staked on one another, as shown in FIG. 2. These liquid processing units may include an antireflective film coating unit (BARC) 26; a resist coating unit (COT) 27; and a developing unit (DEV) 28 for developing the wafer W with a developing fluid.

An exposure apparatus B4 is connected to the front side of the unit rack U3 of the processing section B2 through an interface section B3. The exposure apparatus B4 may be an immersion exposure apparatus. The interface section B3 includes a first transfer chamber 3A and a second transfer chamber 3B provided on the rear and front sides, respectively. These transfer chambers 3A and 3B contain a first transfer arm 31 and a second transfer arm 32, respectively. These arms are capable of moving vertically, rotating around their vertical axis, and moving in the X-axis and Y-axis directions.

In the first transfer chamber 3A, a unit rack U6 is provided on the right side of the first transfer arm 31. The unit rack U6 is made up of: a transfer unit; a high-precision temperature control unit (CPL); a heating-and-cooling unit (PEB) for performing a post-exposure baking treatment to a wafer W that has been subjected to immersion exposure; and a cleaning apparatus (or cleaning unit) 4 according to the present invention. These units are stacked on one another in the vertical direction. The high-precision temperature control unit (CPL), the heating-and-cooling unit (PEB), and the cleaning apparatus 4 may be installed in the unit racks U1, U2, and U3 of the processing section B2.

There will now be briefly described the process flow of steps for processing each wafer W in the above resist pattern forming system. Each wafer W in a carrier 2 mounted on the carrier mounting section B1 is transferred through the temperature control unit (CPL), the antireflective film forming unit (BARC), the heating unit (BAKE), the temperature control unit (CPL), the coating unit (COT), and the heating unit (PAB) in the processing section B2 in that order. These units perform predetermined processing to the wafer W. Then, the wafer W is transferred to the exposure apparatus B4 where immersion exposure is performed on the wafer W while a deionized water film is formed on the surface of the wafer W. After the exposure process, the wafer W is transferred to the cleaning apparatus 4 in the interface section B3 where at least the surface and the peripheral portion of the wafer W are cleaned and dried. Then, the wafer W is transferred through the heating unit (PEB), the high-precision temperature control unit (CPL), the developing unit (DEV), the heating-and-cooling unit (POST), and the temperature control unit (CPL) in the processing section B2 in that order. These units perform predetermined processing to the wafer W before it is returned to a carrier 2 on the carrier mounting section B1.

With reference to FIGS. 3 to 7, there will now be described a first embodiment of the cleaning apparatus 4 according to the present invention incorporated in the above resist pattern forming system, specifically, in the coating-and-developing apparatus. Reference numeral 41 denotes a flat, cylindrical airtight container for containing a wafer W which is a circular substrate. The airtight container 41 is made up of a container body 41A and a cover 41B that can be raised and lowered by a lifting mechanism 41C. A vacuum chuck (or substrate holding unit) 42 is provided in the airtight container 41 to hold the wafer W in a horizontal attitude. The vacuum chuck 42 includes a ring-shaped vacuum portion 42a that holds the wafer W by suction while the vacuum portion 42a surrounds the center portion of the back surface of the wafer W. The vacuum chuck 42 is connected to a vacuum pump 43. Gaps are defined between the top and back surfaces of the wafer W held in the vacuum chuck 42 and the inner surfaces of the airtight container 41 (in the illustrated embodiment, between the front surface of the wafer W and the lower surface of the cover 41B and between the back surface of the wafer W and the upper surface of the bottom wall of the container body 41A). These gaps are small, and are preferably not less than 1 mm, but not more than 5 mm. A gap is also defined between the peripheral edge of the wafer W and the inner circumferential surface of the airtight container 41 (in the illustrated embodiment, the inner surface of the circumferential side wall of the container body 41A). This gap is also small, and is preferably not less than 1 mm, but not more than 5 mm.

The upper portion of the airtight container 41 (in the illustrated embodiment, the cover 41B) has a fluid supply hole 40 at a position corresponding to the center portion of the surface of the wafer W held by the vacuum chuck 42, in order to supply a cleaning liquid to the center portion of the surface of the wafer W. A fluid supply path 5 is connected to the fluid supply hole 40. That is, the fluid supply hole 40 provides a fluid outlet end opening of the fluid supply path 5 which opens into the interior of the airtight container 41. The fluid supply path 5 branches into a cleaning liquid supply path 51 and a dry gas supply path 52. A cleaning liquid supply source 53 is connected to the cleaning liquid supply path 51. A cleaning liquid flow rate adjusting unit 51a, a filter 51b, and a deaerating module 51c are provided in the cleaning liquid supply path 51. A dry gas supply source 54 is connected to the dry gas supply path 52. A dry gas flow rate adjusting unit 52a and a filter 52b are provided in the dry gas supply path 52. The cleaning liquid may be, for example, deionized water or functional water; and the dry gas may be, for example, nitrogen gas. Examples of functional water include ozone-containing water, pH-adjusted water, and water whose molecules have been activated. The filters 51b and 52b are used to remove particles contained in the cleaning liquid and the dry gas, respectively. The deaerating module 51c is used to remove gases dissolved in the cleaning liquid in order to prevent generation of bubbles in the cleaning liquid when it is supplied to the airtight container 41.

In the illustrated embodiment, the cleaning liquid flow rate adjusting unit 51a includes: a main valve MV1; a bypass flow path BP1 for bypassing the main valve MV1; and a sub-valve SV1 provided in the bypass flow path BP1. Likewise, the dry gas flow rate adjusting unit 52a includes: a main valve MV2; a bypass flow path BP2 for bypassing the main valve MV2; and sub-valve SV2 provided in the bypass flow path BP2. The cleaning liquid or the dry gas can be selectively supplied to the airtight container 41 by switching the valves in the cleaning liquid flow rate adjusting unit 51a and the dry gas flow rate adjusting unit 52a.

A fluid discharge portion 44 for discharging the cleaning liquid from the airtight container 41 is formed in the bottom portion of the airtight container 41 (in the illustrated embodiment, in the bottom portion of the container body 41A) such that the fluid discharge portion 44 runs along a circle having its center located on the center axis of the wafer W held by the vacuum chuck 42. Specifically, the fluid discharge portion 44 may be a groove having a ring shape encircling the vacuum chuck 42. Discharge pipes 44a are connected to the fluid discharge portion 44 to discharge fluid from the airtight container 41. That is, the upper end opening of the fluid discharge portion 44 provides a fluid inlet end opening of the fluid discharge path made up of the fluid discharge portion 44 and the discharge pipes 44a. The discharge pipes 44a are connected to a gas-liquid separator 45, to which a waste liquid tank 46 for trapping a liquid (cleaning liquid) and a suction means 47 for sucking a gas (dry gas) are connected. The suction means 47 may be, for example, a pump or an ejector. Reference sign V1 denotes a liquid discharge valve; and V2 denotes a gas discharge valve.

Plural (e.g., three) lifting pins 48 are provided inside the vacuum chuck 42 to help transfer the wafer W to and from the vacuum chuck 42. The lifting pins 48 can be raised and lowered by a lifting mechanism 48a. Specifically, the tips of these lifting pins 48 can be moved between a transfer position above the container body 41A and a processing position below the vacuum chuck 42. At the transfer position the wafer W is transferred between the tips of the lifting pins 48 and a transfer means (or the first transfer arm 31) not shown.

The cleaning apparatus 4 includes a control unit C that controls the operation of all components involved with the cleaning process, such as the cleaning liquid flow rate adjusting unit 51a, the dry gas flow rate adjusting unit 52a, the lifting mechanisms 41C and 48a, the vacuum pump 43, the liquid discharge valve V1, and the gas discharge valve V2.

Figure 5:
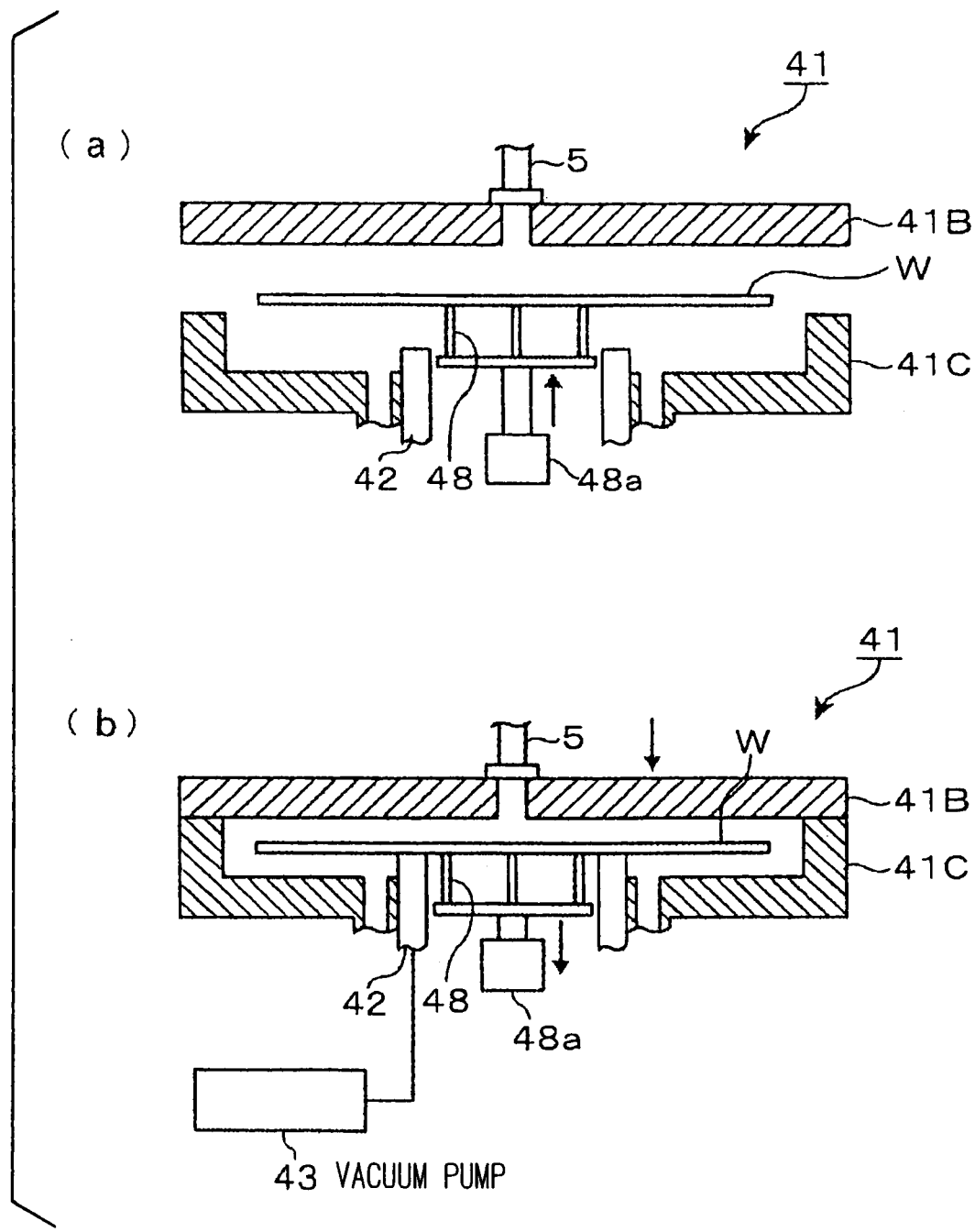
FIG. 5 shows schematic cross-sectional views illustrating the operation of the cleaning apparatus shown in FIG. 4.
Figure 6:
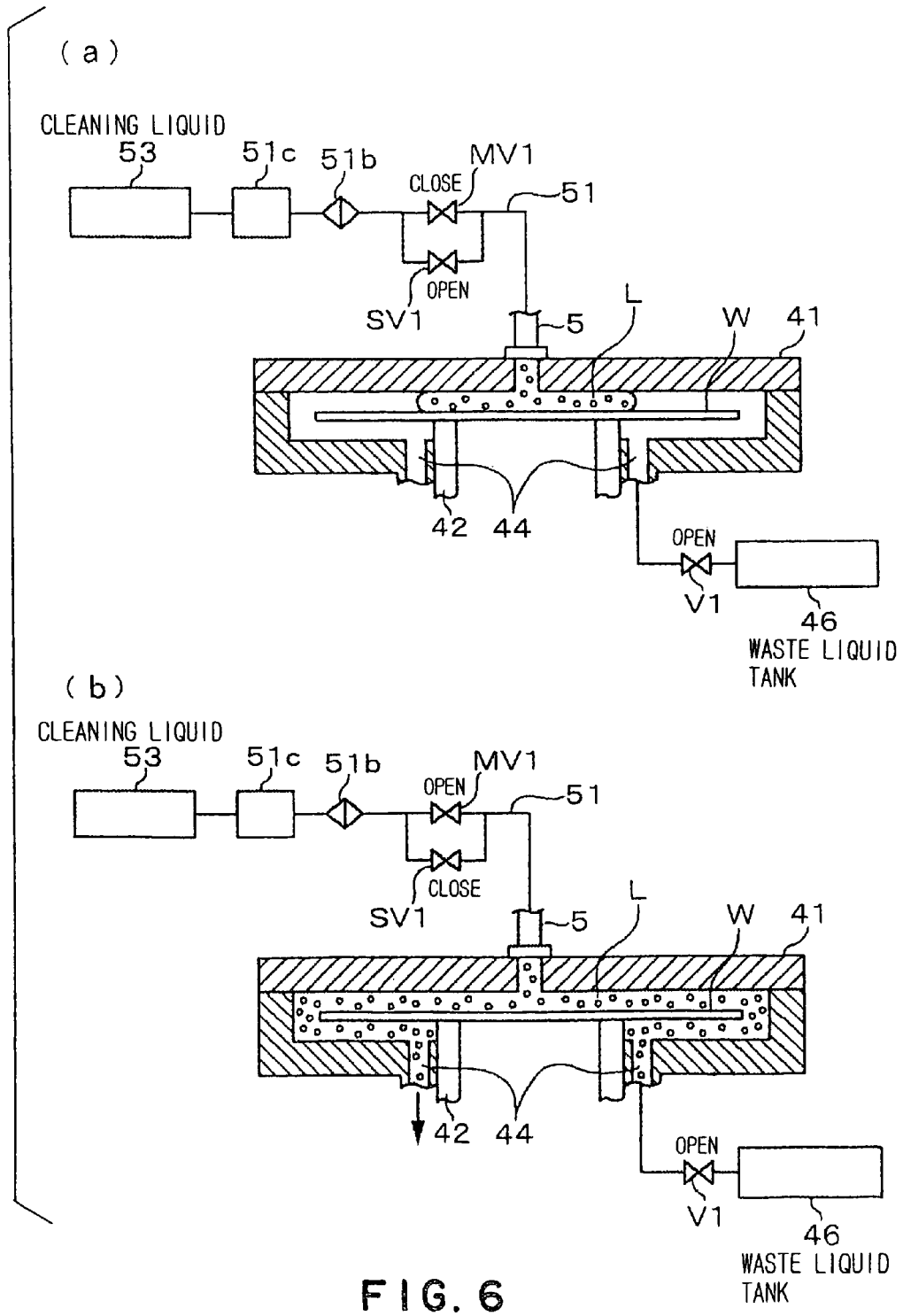
FIG. 6 shows other schematic cross-sectional views illustrating the operation of the cleaning apparatus shown in FIG. 4.

The operation of the cleaning apparatus 4 will now be described with reference to FIGS. 5 to 7. As shown in FIG. 5(a), at first, the cover 41B is opened; the lifting pins 48 are moved to the transfer position; and a wafer W is transferred from the first transfer arm 31 (not shown in FIG. 5(a)) to the lifting pins 48. Then, as shown in FIG. 5(b), the wafer W is transferred to the vacuum chuck 42 by lowering the lifting pins 48 to the processing position; and the vacuum pump 43 is activated to cause the vacuum chuck 42 to hold the wafer W by suction. Then, the cover 41B closes the airtight container 41, thereby enclosing the wafer W within the airtight container 41. The wafer W carried into the cleaning apparatus 4 is one that has been subjected to immersion exposure in the exposure apparatus B4.

Then, the sub-valve SV1 and the liquid discharge valve V1 are opened, while the other valves V2, MV1, SV2, and MV2 are closed, to supply a cleaning liquid L to the airtight container 41, as shown in FIG. 6(a). At that time, the flow rate of the cleaning liquid L (a first cleaning liquid flow rate) is set so that bubbles (which adversely affects the cleaning uniformity) are not generated in the airtight container 41. For example, the flow rate is set to approximately 0.2 to 1 l/min. The cleaning liquid L is supplied for approximately 10 seconds to fill up the gaps between the wafer W and the airtight container 41.

Then, as shown in FIG. 6(b), the main valve MV1 and the liquid discharge valve V1 are opened, while the other valves V2, SV1, SV2, and MV2 are closed, to supply the cleaning liquid L to the airtight container 41 for approximately 10 seconds at a second cleaning liquid flow rate higher than the first cleaning liquid flow rate, for example, 0.5 to 2 l/min. That is, the cleaning liquid L is supplied to the airtight container 41 and discharged through the fluid discharge portion 44 while maintaining the state where the gaps between the wafer W and the airtight container 41 are filled up with the cleaning liquid L. Thereby, in the airtight container 41, the cleaning liquid L flows and uniformly spreads radially from the center portion of the front surface of the wafer W toward the peripheral portion, then turns around into the gap on the back side of the wafer W, and then flows to the fluid discharge portion 44 outside the vacuum chuck 42, while the cleaning liquid L is in contact with the wafer W. Therefore, the dissolved resist components and the particles adhered to the top and back surfaces of the wafer W are removed, carried by the cleaning liquid L, and discharged through the fluid discharge portion 44.

Figure 7:
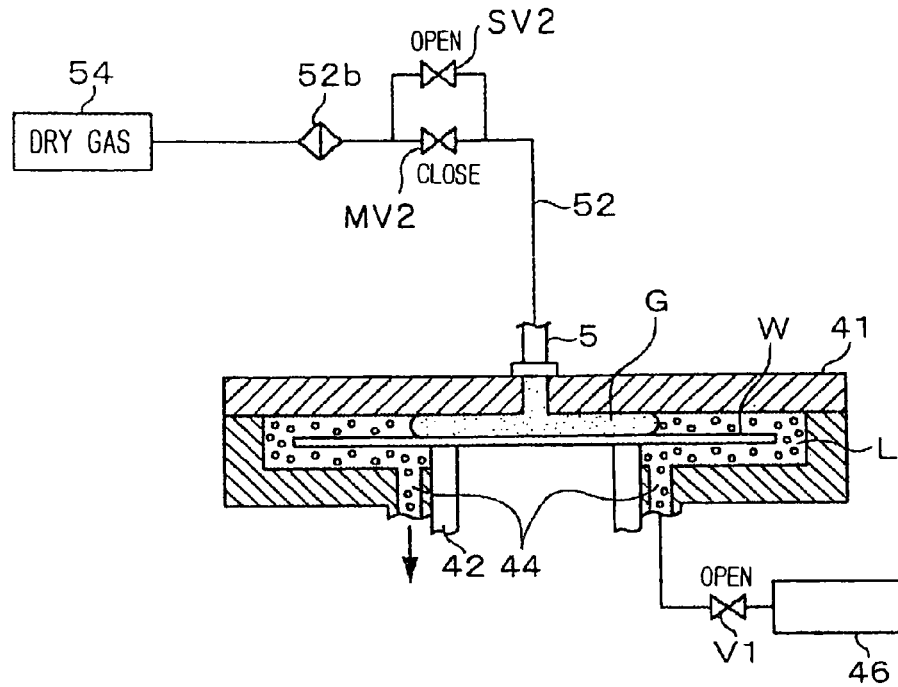
FIG. 7 shows still other schematic cross-sectional views illustrating the operation of the cleaning apparatus shown in FIG. 4.
Figure 7:
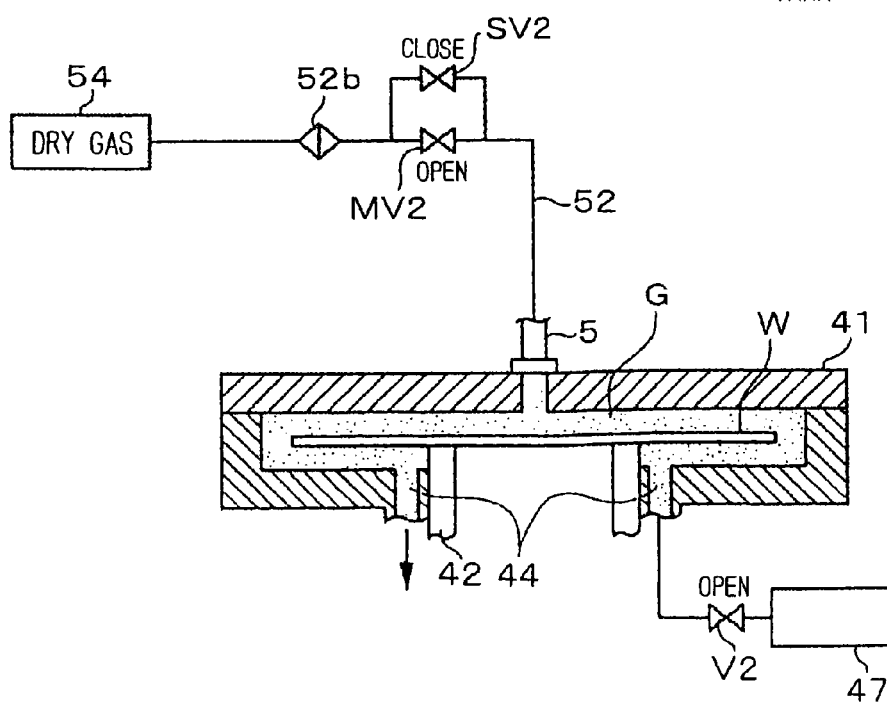

Then, as shown in FIG. 7(*a*), the sub-valve SV2 and the liquid discharge valve V1 are opened, while the other valves V2, MV1, SV1 and MV2 are closed, to supply a dry gas G to the airtight container 41. At that time, the flow rate of the dry gas G (a first dry gas flow rate) is set so that the dry gas G can push the cleaning liquid L out of the airtight container 41. For example, the flow rate is set to approximately 0.5 to 10 l/min. It should be noted that supplying the dry gas G to the airtight container 41 at a high flow rate might prevent uniform discharge of the cleaning liquid. The dry gas G is supplied for approximately 10 seconds to discharge the cleaning liquid L from the airtight container 41 to the waste liquid tank 46 through the fluid discharge portion 44, thus replacing the cleaning liquid L in the airtight container 41 with the dry gas G.

Then, as shown in FIG. 7(*b*), the main valve MV2 and the gas discharge valve V2 are opened, while the other valves V1, SV2, MV1 and SV2 are closed, to supply the dry gas G to the airtight container 41 for approximately 10 seconds at a second dry gas flow rate higher than the first dry gas flow rate, for example, 5 to 50 l/min. This causes the dry gas G to pass through the gaps between the wafer W and the airtight container 41, thereby drying the front and back surfaces of the wafer W.

Upon completion of the cleaning and drying of the wafer W, all valves V1, V2, MV1, SV1, MV2, and SV2 are closed, the cover 41B is opened, and the vacuum chuck 42 stops suctioning to release the wafer W. Then, the lifting pins 48 are raised to the transfer position, and the wafer W is transferred to the first transfer arm 31. After that, the first transfer arm 31 carries the wafer W to a heating unit which performs PEB treatment, the next process.

The above cleaning apparatus 4 has the following advantageous effects:

(1) While the cleaning liquid L fills up the gaps between the wafer W and the airtight container 41, the cleaning liquid L flows and uniformly spreads radially from the center portion of the front surface of the wafer W toward the peripheral portion, then turns around the peripheral edge of the wafer W into the gap on the back side of the wafer W, then uniformly flows radially inward, and then finally flows into the fluid discharge portion 44. Thus, the cleaning liquid is brought into contact with the entire front surface of the wafer W and the portions of the back surface of the wafer W outside the fluid discharge portion 44, thereby assuredly cleaning these areas. Further, uniform distribution of the radial flow velocity of the cleaning liquid with respect to the circumferential direction of the wafer W can be achieved, allowing the wafer W to be uniformly cleaned with respect to the circumferential direction of the wafer W. It is not necessary to rotate the wafer W in order to achieve the above cleaning effect, eliminating the need for a spin chuck. This results in a reduction in the parts count and in the size of the cleaning apparatus.

(2) By virtue of its principle of operation, the cleaning apparatus 4 according to the present invention does not require a cup of a large-diameter required by spin cleaning apparatuses to capture the cleaning liquid scattered from the wafer. Furthermore, the gaps between the wafer W and the inner surfaces of the airtight container 41 are small, allowing the size of the cleaning apparatus 4 to be reduced. Such a small sized cleaning apparatus 4 contributes to reducing the space occupied by the interface section B3 or the processing section B2 in which the cleaning apparatus is incorporated and thereby contributes to preventing an increase in the size of the resist pattern forming apparatus. Further, since the gaps between the wafer W and the inner surfaces of the airtight container 41 are small, only small amounts of cleaning liquid and dry gas are required.

(3) Since the fluid discharge portion 44 is provided around and in close proximity to the cylindrical vacuum chuck 42, the outer circumferential surface of the vacuum chuck 42 constitutes the end of the flow path of the cleaning liquid L and the dry gas G. As a result, the cleaning liquid L and the dry gas G smoothly flows into the fluid discharge portion 44, enhancing the cleaning and drying effects.

(4) Since the lifting pins 48 are arranged inside the cylindrical vacuum chuck 42, the processing fluid does not leak into the space in which the lifting pins 48 are disposed during the process.

(5) A wafer W that has been subjected to immersion exposure is cleaned in the cleaning apparatus 4 before the next heating (PEB) process to remove the resolved resist components and particles that have been generated during the immersion exposure process and attached to the front and back surfaces of the wafer W. Thereby, scattering or transferring of particles to transfer arms and other processing units can be prevented. Furthermore, degradation in the in-plane temperature uniformity of the wafer W during the heating (PEB) process after the exposure process due to the dissolved components and the particles can be prevented. Accordingly, in a case where a chemical amplification resist is used, the acidic catalysts generated during the exposure process can be uniformly diffused in the resist, making it possible to maintain the uniformity of the line width of the pattern. Further, defects in the developing process due to particles can be prevented.

In the illustrated embodiment, the fluid discharge portion is a circular continuous groove running along a circle having its center located on the center axis of the wafer W, but is not limited thereto. The fluid discharge portion may be such that it extends along a circle having its center located on the center axis of the wafer W with discontinuity. For example, a number of fluid discharge holes may be formed in the bottom portion of the airtight container such that they are arranged along a circle having its center located on the center axis of the wafer W.

Further, a discharge path of the cleaning liquid and a discharge path for the dry gas may be separately arranged in the airtight container 41. Still further, instead of connecting the fluid supply path 5, formed by the union of the cleaning supply path 51 and the dry gas supply path 52, to the fluid supply hole 40, the cleaning supply path 51 may be directly connected to the fluid supply hole 40 and the dry gas supply path 52 separated from the cleaning liquid supply path 51 may be connected to a portion of the airtight container 41 other than the fluid supply hole 40.

Several variations of the cleaning apparatus 4 will be described with reference to FIGS. 8 to 20.

The cleaning apparatus 4 shown in FIGS. 8 to 12 are configured to ensure that the outline of the cleaning liquid expands like concentric circles immediately after it is supplied into the airtight container.

Figure 8:
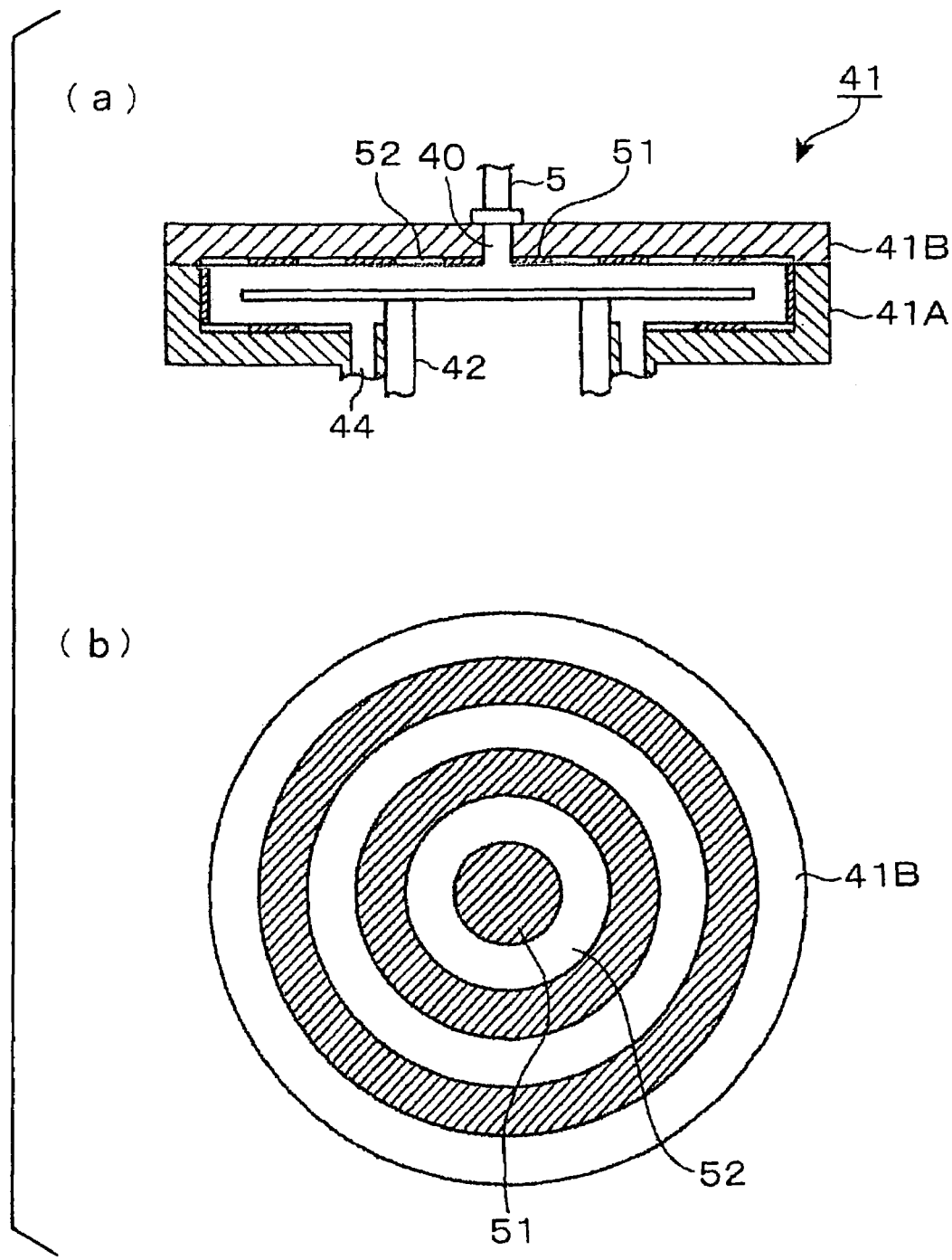
FIG. 8 shows schematic views illustrating a first variation of the cleaning apparatus, wherein (a) is a cross-sectional view and (b) is a plan view showing the undersurface of the cover body.

First of all, in the cleaning apparatus 4 shown in FIG. 8, the inner surfaces of the airtight container 41 have hydrophilic regions 151 (shown shaded in the figure) having been subjected to a hydrophilizing treatment and hydrophobic regions 152 (shown non-shaded in the figure) having been subjected to a hydrophobizing treatment which are arranged concentrically and alternately. FIG. 8(*b*) is a schematic plan view of an inner surface of the cover 41B of the airtight container 41.

Referring to these figures, one hydrophilic region 151, having a shape of a circle having its center located on the center axis of the wafer W, is provided on the center portion of the cover 41B, which faces the center portion of the wafer and includes the fluid supply hole 40 (not shown in FIG. 8(b)). Provided outside this hydrophilic region 151 is a hydrophobic region 152 having a shape of a ring concentric with the circular hydrophilic region 151. Further, another hydrophilic region 151 having a shape of a ring is provided outside the hydrophobic region 152. As shown in the vertical cross-sectional view of the airtight container 41 in FIG. 8(a), ring-shaped hydrophilic and hydrophobic regions are alternately formed on the inner surfaces of the airtight container 41 from the fluid supply hole 40 to the fluid discharge portion 44. The width of each region in the radial direction may be set to approximately 10 mm. All the other components are the same as those described in connection with the foregoing embodiment.

As previously described, the gaps between the wafer W and the inner surfaces of the airtight container 41 are small. Therefore, the cleaning liquid supplied to the center portion of the front surface of the wafer W, that is, the cleaning liquid supplied to the gap between the circular hydrophilic region 151 at the center and the wafer W, is shed by the hydrophobic region 152 adjacent the circular hydrophilic region 151 and hence cannot enter the gap between the hydrophobic region 152 and the wafer W. Only after the gap between the circular hydrophilic region 151 at the center and the wafer W has been filled up with the cleaning liquid and hence the internal pressure of the gap has been increased, the cleaning liquid can enter the gap between the adjacent hydrophobic region 152 and the wafer W. Since the cleaning liquid thus spreads in multistage, radial traveling speeds of the cleaning liquid are equalized with respect to the circumferential direction. When a dry gas is supplied after completion of the cleaning process, the cleaning liquid is uniformly, with respect to the circumferential direction, removed from the gaps between the wafer W and the inner surfaces of the airtight container 41 according to the above principle. This means that the cleaning liquid is unlikely to remain in the gaps, allowing the cleaning liquid to be quickly replaced by the dry gas.

Figure 9:
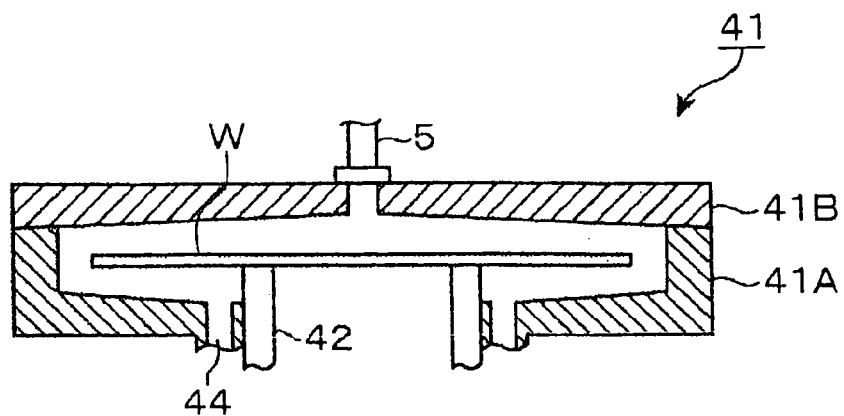
FIG. 9 shows a schematic cross-sectional view illustrating a second variation of the cleaning apparatus.

In the cleaning apparatus 4 shown in FIG. 9, the inner surface of the upper portion of the airtight container 41 (i.e., the lower surface of the cover 41B) and the inner surface of the bottom portion of the airtight container 41 (i.e., the upper surface of the bottom portion of the container body 41A) each have an inclination of approximately 1 to 2 degrees with respect to the horizontal plane, so that the gaps between the surfaces of the wafer W and the inner surfaces of the airtight container 41 gradually decrease as location of measurement of the gap goes from the center portion of the substrate toward the peripheral portion of the substrate. Also in this case, the gaps between the wafer W and the inner surfaces of the airtight container 41 are in the range of 1 mm to 5 mm. All other components are similar to those described in connection with the previous examples.

If the gaps between the wafer W and the inner surfaces of the airtight container 41 are set to be constant with respect to radial directions of the wafer W, the volume of the gaps per unit area of the wafer W increases according to the proximity to the peripheral portion of the wafer W. Therefore, if the cleaning liquid supply rate is constant, the radial traveling speeds of the cleaning liquid decrease as it approaches the peripheral portion of the wafer W.

With the configuration shown in FIG. 9, on the other hand, the volume of the gaps per unit area of the wafer W can be set to substantially the same value regardless of the radial position on the wafer W. Accordingly, the traveling speeds of the cleaning liquid in radial directions can be set to be substantially the same value regardless of the radial position on the wafer W, allowing the wafer W to be substantially uniformly cleaned with respect to the radial directions.

Further, since the upper inner surface of the airtight container 41 has an inclination as shown in FIG. 9, when a dry gas is supplied after completion of the cleaning process, the cleaning liquid is pushed by the dry gas such that the cleaning liquid rapidly flows from the center portion of the wafer W toward the peripheral portion of the wafer W. As a result, the replacement of the cleaning liquid by the dry gas proceeds easily. Further, since the inner surface of the bottom portion of the airtight container 41 is inclined downwardly toward the fluid discharge portion 44, the cleaning liquid in the airtight container 41 can smoothly flow into the fluid discharge portion 44 and discharged from the airtight container 41. Therefore, the cleaning liquid is quickly replaced by the dry gas, allowing the front and back surfaces of the wafer W to be rapidly dried.

Figure 10:
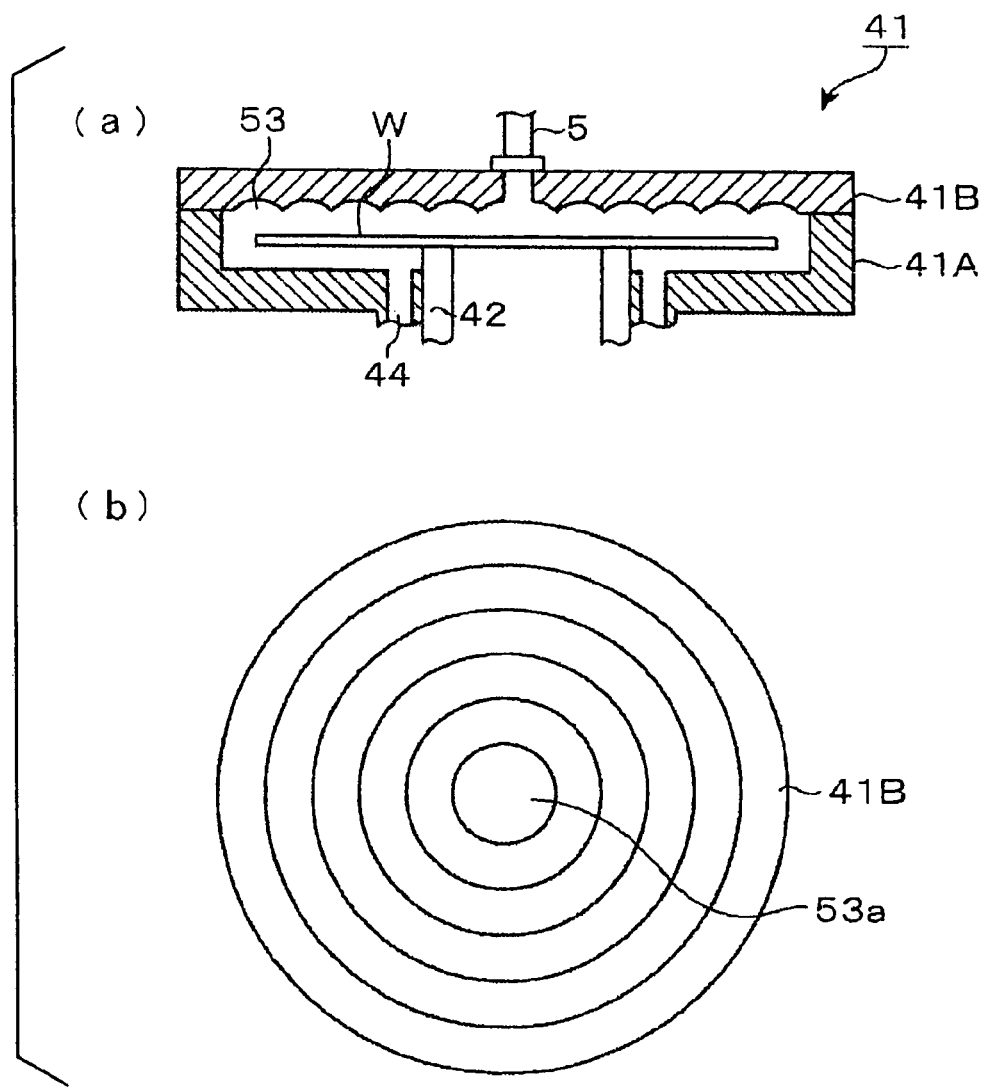
FIG. 10 shows schematic views illustrating a third variation of the cleaning apparatus, wherein (a) is a cross-sectional view and (b) is a plan view showing the undersurface of the cover body.

In the cleaning apparatus 4 shown in FIG. 10, a plurality of recesses 153 concentric about the center axis of the wafer W are formed in the upper inner surface of the airtight container 41 (i.e., the lower surface of the cover 41B). As shown in FIG. 10(a), the recesses 153 have an outline of a wave pattern, in cross-sectional view, composed of circular arcs connected to one another. FIG. 10(b) is a plan view showing the lower surface of the cover 41B of the airtight container 41. As shown in FIG. 10(b), a first recess 153a having a circular shape is formed in the center portion of the cover 41B facing the center portion of the wafer W. Further, plural ring-shaped recesses are concentrically formed outside the first recess 153a. The width of each recess in the radial direction is between 5 mm and 20 mm, preferably approximately 8 mm. The maximum depth of each recess is between 0.5 mm and 3 mm, preferably approximately 2 mm.

The recesses 153 act as buffers. The cleaning liquid first fills up the gap between the innermost recess 153a and the wafer W and then spreads into the gap between the outwardly adjacent recess 153 and the wafer W. Thus, since the cleaning liquid spreads in multistage, the radial traveling speeds of the cleaning liquid in radial directions of the wafer W are equalized with respect to the circumferential direction. Immediately after the starting supplying the dry gas after completion of the cleaning process, the cleaning liquid is uniformly, with respect to the circumferential direction, removed from the gap between the wafer W and the upper inner surface of the airtight container 41 according to the above principle. This means that the cleaning liquid is unlikely to remain, allowing the cleaning liquid to be quickly replaced by the dry gas. Further, since the upper inner surface of the airtight container has irregularities (the recesses 153), the cleaning liquid flow becomes turbulent, enhancing the effectiveness of the cleaning process.

Figure 11:
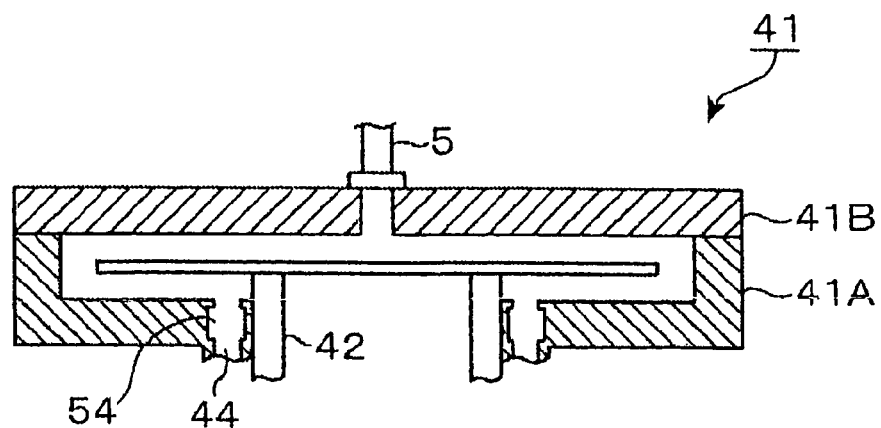
FIG. 11 is a schematic cross-sectional view illustrating a fourth variation of the cleaning apparatus.

In the cleaning apparatus shown in FIG. 11, a cylindrical buffer chamber 114 is provided within the fluid discharge portion 44 such that it occupies an entire middle portion of the fluid discharge portion 44. When the cleaning liquid or dry gas is discharged from the airtight container 41, it first fills the buffer chamber 54 and is discharged therefrom toward the downstream side. Therefore, the discharge pressures of the cleaning liquid or dry gas can be equalized with respect to the radial direction of the wafer W near the inlet of the fluid discharge portion 44. As a result, the flow rates of the cleaning liquid or the dry gas around the wafer W can be equalized with respect to the circumferential direction.

Figure 12:
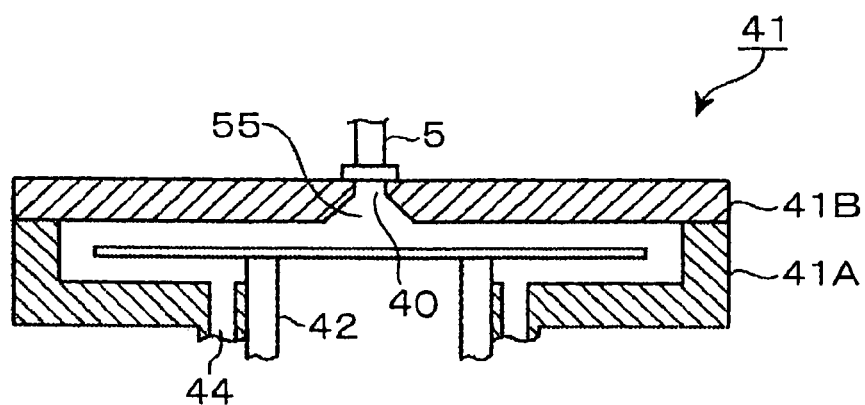
FIG. 12 is a schematic cross-sectional view illustrating a fifth variation of the cleaning apparatus.

In the cleaning apparatus shown in FIG. 12, the lower end outlet portion 55 of the fluid supply hole 40 is tapered so as to downwardly widen. Therefore, the cleaning liquid and the dry gas enter the airtight container 41 while radially spreading, making it easy for the cleaning liquid and the dry gas to spread uniformly and quickly from the center portion of the wafer W toward the peripheral portion.

Figure 13:
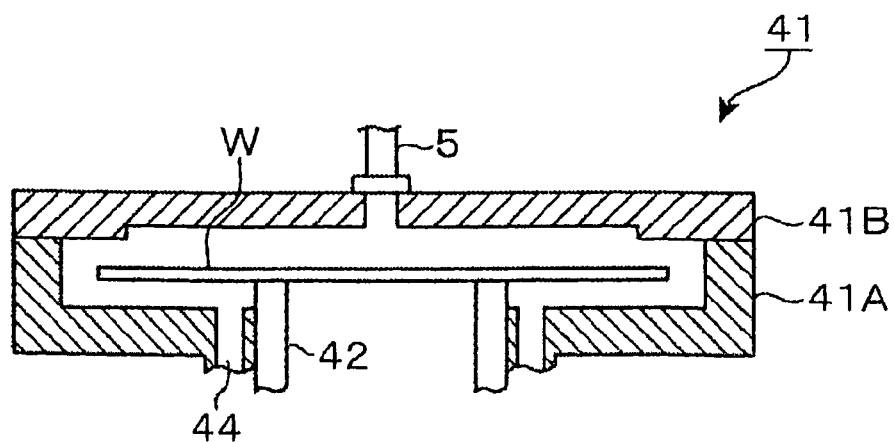
FIG. 13 is a schematic cross-sectional view illustrating a sixth variation of the cleaning apparatus.

In the cleaning apparatus shown in FIG. 13, the thickness of the cover 41B of the airtight container 41 is changed (or the lower surface of the cover 41B has a step) such that the gap between the surface of the peripheral portion of the wafer W and the airtight container 41 is smaller than that between the surface of the center portion of the wafer W and the airtight container 41. The gap between the surface of the peripheral portion of the wafer W and the airtight container 41 is preferably between approximately 0.5 mm and 1 mm. The gaps between the other portions of the wafer W and the airtight container 41 are 5 mm or less.

Also in this case, the cleaning liquid first fills up the gap between the surface of the center portion of the wafer W and the airtight container 41 and thereafter spreads outward. Therefore, the radial flow velocities of the cleaning liquid are equalized with respect to the circumferential direction at the portion where the size of the gap changes, even if the radial flow velocities of the cleaning liquid flowing through the gap inside the portion where the size of the gap changes are not equalized.

The smaller the gap, the higher the cleaning liquid pressure and hence the higher the cleaning power. Since the peripheral edge portion of the wafer W has a beveled shape, a large amount of particles is attached to the beveled surface. Therefore, it is advantageous to clean the peripheral portion of the wafer W with high cleaning power. When the dry gas is supplied, the above arrangement also allows the radial flow velocities of the dry gas to be equalized with respect to the circumferential direction.

Figure 14:
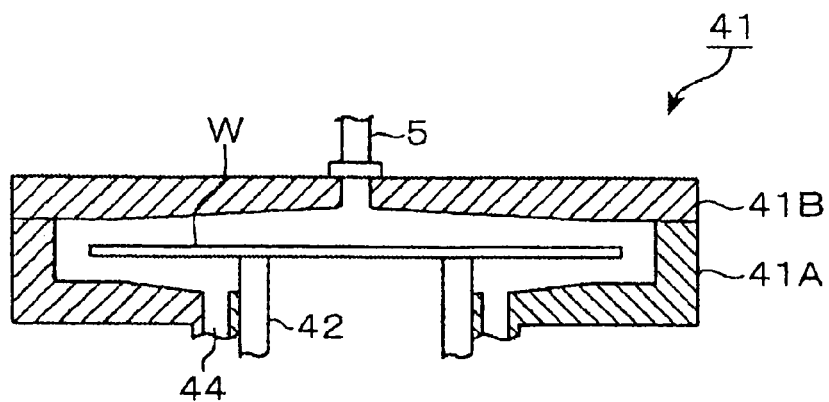
FIG. 14 is a schematic cross-sectional view illustrating a seventh variation of the cleaning apparatus.

Instead of suddenly narrowing the gap between the front surface of the wafer W and the airtight container 41 at a peripheral portion of the wafer W as shown in FIG. 13, the gaps may be formed as shown in FIG. 14 in which: the front surface of the bottom portion of the container body 41A and the lower surface of the cover 41B is be inclined such that the size of the gaps between the wafer W and the airtight container 41 are gradually reduced according to the proximity to the peripheral portion of the wafer W; and the gaps of a constant size of approximately 0.5 to 1 mm are formed between the peripheral portions of the wafer W and the airtight container 41. The size of the gaps between the wafer W and the airtight container at portions other than the peripheral portion of the wafer W may be set to 5 mm or less. This arrangement also allows the radial flow velocities of the cleaning liquid and the dry gas to be equalized with respect to the circumferential direction, and achieves enhanced cleaning efficiency of the peripheral portion of the wafer W.

Figure 15:
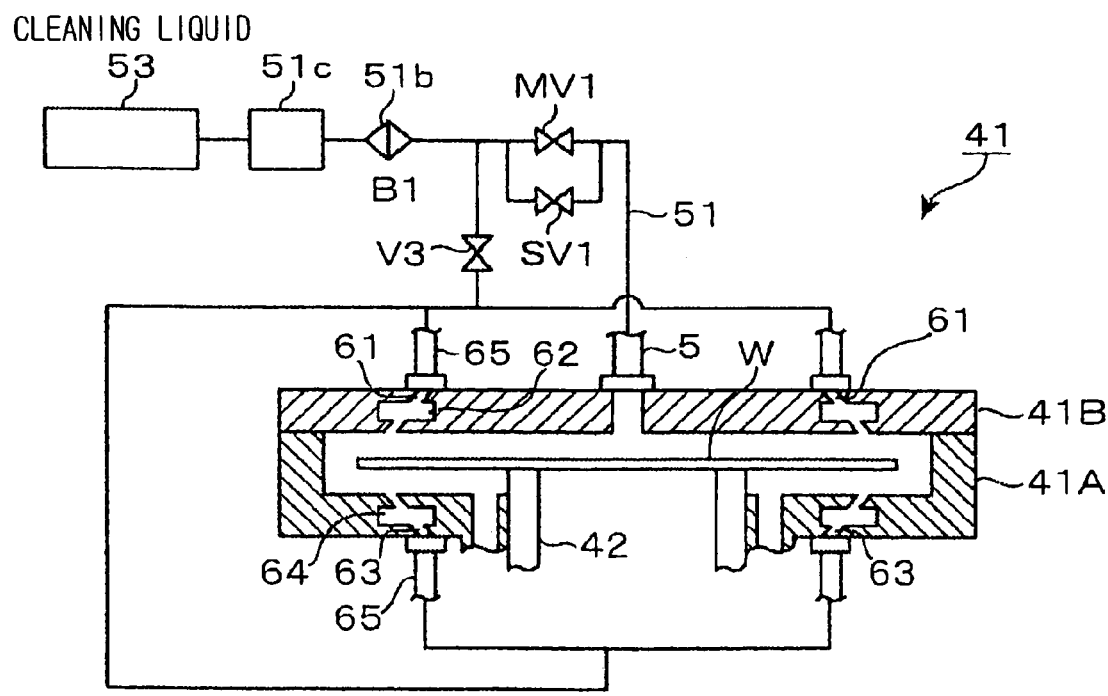
FIG. 15 is a schematic cross-sectional view illustrating an eighth variation of the cleaning apparatus.
Figure 16:
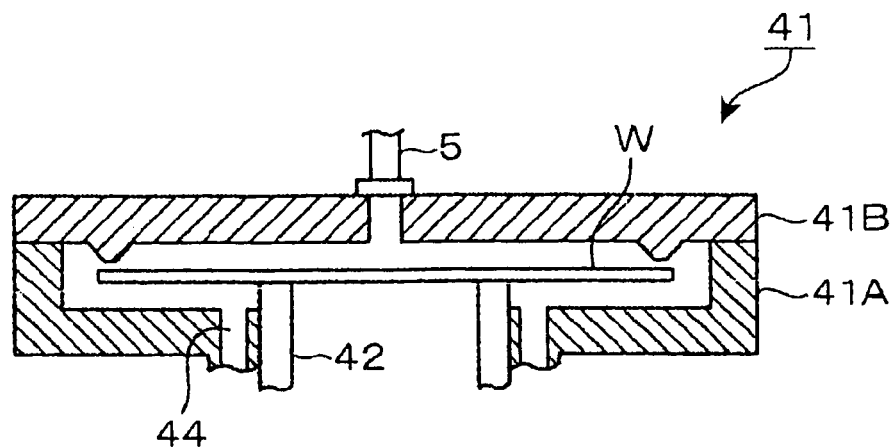
FIG. 16 is a schematic cross-sectional view illustrating a ninth variation of the cleaning apparatus.

The cleaning apparatus 4 shown FIGS. 15 and 16 have a configuration that enhances cleaning efficiency of the wafer peripheral portion. In the cleaning apparatus of FIG. 15, a supplementary cleaning liquid supply portions for supplying a cleaning liquid to the peripheral portions of the front and back surfaces of the wafer W is formed in the airtight container 41 such that they runs along circles having their centers located on the center axis of the wafer W. A first cleaning liquid flow path 61 for supplying a cleaning liquid to the peripheral portion of the front surface of the wafer W is formed in the cover 41B such that it runs along the entire circumference of the cover 41B. This cleaning liquid flow path 61 has a buffer chamber 62 in its middle portion. The cleaning liquid flow path 61 is inclined such that it is dislocated radially outwardly according to the proximity to its lower end, thereby allowing the cleaning liquid flow path 61 to discharge the cleaning liquid toward the peripheral portion of the wafer W.

Likewise, a second cleaning liquid flow path 63 for supplying a cleaning liquid to the peripheral portion of the back surface of the wafer W is formed in the bottom portion of the container body 41A such that it runs along the entire circumference of the container body 41A. This cleaning liquid flow path 63 has a buffer chamber 64 in its middle portion and is inclined such that it is dislocated radially outwardly according to the proximity to its upper end, thereby allowing the cleaning liquid flow path 63 to discharge the cleaning liquid toward the peripheral portion of the back surface of the wafer W.

The first and second cleaning liquid flow paths 61 and 63 are connected to the cleaning liquid supply path 51 through piping 65 and a supply valve V3. A cleaning liquid is supplied to the first and second cleaning liquid flow paths 61 and 63 to be discharged therefrom toward the peripheral portions of the front and back surfaces of the wafer W at a predetermined timing.

This arrangement allows the cleaning liquid to be directly sprayed to the peripheral portions of the front and back surfaces of the wafer W, to which have a large amount of particles adhered, and thus achieves increased cleaning power for these peripheral portions, allowing particles to be assuredly removed. Although the supplementary cleaning liquid supply portion is made up of the first and second cleaning liquid flow paths 61 and 63 and a cleaning liquid supply system in the embodiment shown in FIG. 15, the supplemental cleaning liquid supply portion may include only one of these cleaning liquid flow paths 61 and 63. Further, instead of forming the cleaning liquid flow paths 61 and 63 along the entire circumferences of the cover 41B and the bottom portion of the container body 41A, respectively, of the airtight container 41, a number of nozzles for supplying a cleaning liquid to the peripheral portion of the wafer W may be arranged along a circle having its center located on the center axis of the wafer W. Further, the cleaning liquid flow paths 61 and 63 may be configured so that they do not include the buffer chambers 62 and 64.

In the cleaning liquid 4 shown in FIG. 16, a ring-shaped protrusion is provided on the lower surface of the cover 41B such that the gap between the front surface of the wafer W and the airtight container 41 drastically decreases to, for example, approximately 0.5 to 1 mm at a position in the peripheral portion of the wafer W, and then drastically increases. The gaps between the other portions of the wafer W and the airtight container 41 are set to 5 mm or less. Since the protrusion exerts an orifice effect on the cleaning liquid flowing through the gap, its flow rate increases around the protrusion, achieving enhanced cleaning effect on the peripheral portion of the wafer W.

Figure 17:
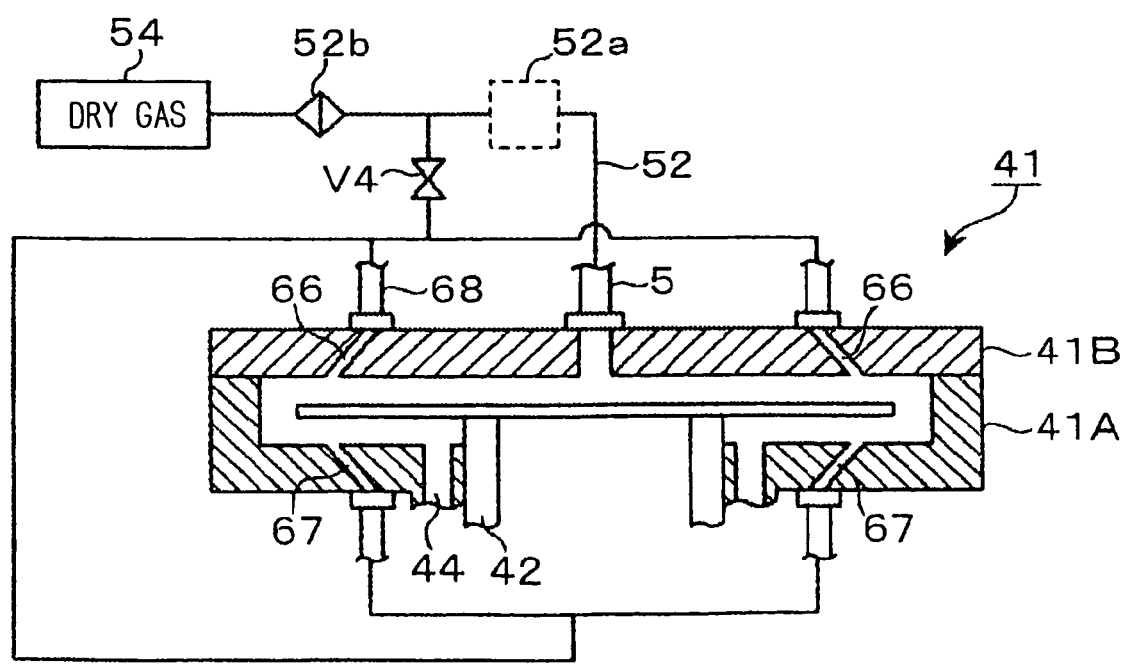
FIG. 17 is a schematic cross-sectional view illustrating a tenth variation of the cleaning apparatus.

The cleaning apparatus 4 shown in FIG. 17 has a configuration that enhances the wafer-drying effect. Specifically, a first dry gas flow path 66 for supplying a dry gas to the peripheral portion of the front surface of the wafer W is formed in the cover 41B such that it runs along the entire circumference of the cover 41B. A second dry gas flow path 67 for supplying a dry gas to the peripheral portion of the back surface of the wafer W is formed in the bottom portion of the container body 41A such that it runs along the entire circumference of the container body 41A.

The first dry gas flow path 66 is inclined such that it is dislocated radially outwardly according to the proximity to its lower end, allowing the dry gas flow path 66 to discharge the cleaning liquid toward the peripheral portion of the front surface of the wafer W. The second dry gas flow path 67 is inclined such that it is dislocated radially outwardly according to the proximity to its upper end, allowing the dry gas flow path 67 to discharge the cleaning liquid toward the peripheral portion of the back surface of the wafer W. The first and second dry gas flow paths 66 and 67 are connected to the dry gas supply path 52 through piping 68 and a supply valve 4. A dry gas is supplied to the first and second dry gas flow paths 66 and 67 to be sprayed therefrom to the peripheral portions of the front and back surfaces of the wafer W, respectively, at predetermined timing.

This arrangement allows the dry gas to be directly sprayed to the peripheral portions of the front and back surfaces of the wafer W, allowing the peripheral portions of the wafer W to be quickly dried. Note that only one of the first and second cleaning liquid flow paths 61 and 63 may be provided. Further, instead of forming the first and second cleaning liquid paths 61 and 63 along the entire circumferences of the cover 41B and the bottom portion of the container body 41A, respectively, of the airtight container 41, a number of nozzles for supplying a dry gas to the peripheral portion of the wafer W may be arranged along circles having their center located on the center axis of the wafer W.

Figure 18:
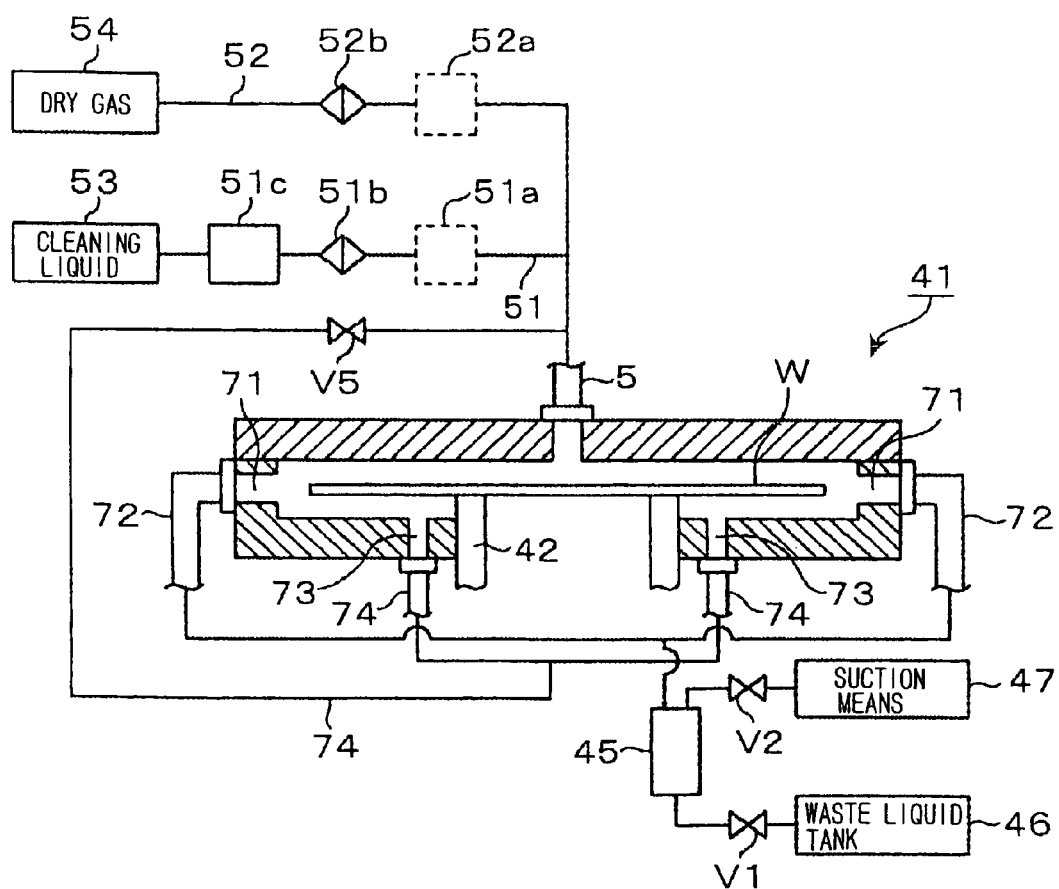
FIG. 18 is a schematic cross-sectional view illustrating an eleventh variation of the cleaning apparatus.

In the cleaning apparatus 4 shown in FIG. 18, a fluid discharge portion 71 is formed in the entire circumferential side portion of the airtight container 41 (the container body 41A) to surround the peripheral edge of the wafer W; that is, the fluid discharge portion 71 runs along a circle having its center located on the center axis of the wafer W. A discharge pipe 72 is connected to the fluid discharge portion 71. The discharge pipe 72 is also connected to the suction means 47 and the waste liquid tank 46 through the gas-liquid separator 45. An annular supply flow path 73 surrounding the vacuum chuck 42 is formed in the bottom portion of the container body 41A to supply a cleaning liquid and a dry gas into the airtight container 41. The supply flow path 73 is connected to the fluid supply path 5 through piping 74 in which a valve V5 is provided.

Also in this case, the cleaning liquid or dry gas supplied to the gaps between the airtight container 41 and the front and back surfaces of the wafer W spreads from the center portion of the wafer W toward the peripheral portion of the wafer W and is eventually discharged through the fluid discharge portion 71 that faces the peripheral edge of the wafer W, thereby uniformly cleaning the front and back surfaces of the wafer W. Note that at least one of the structures shown in FIGS. 9 to 17 may be incorporated into the cleaning apparatus shown in FIG. 18.

Figure 19:
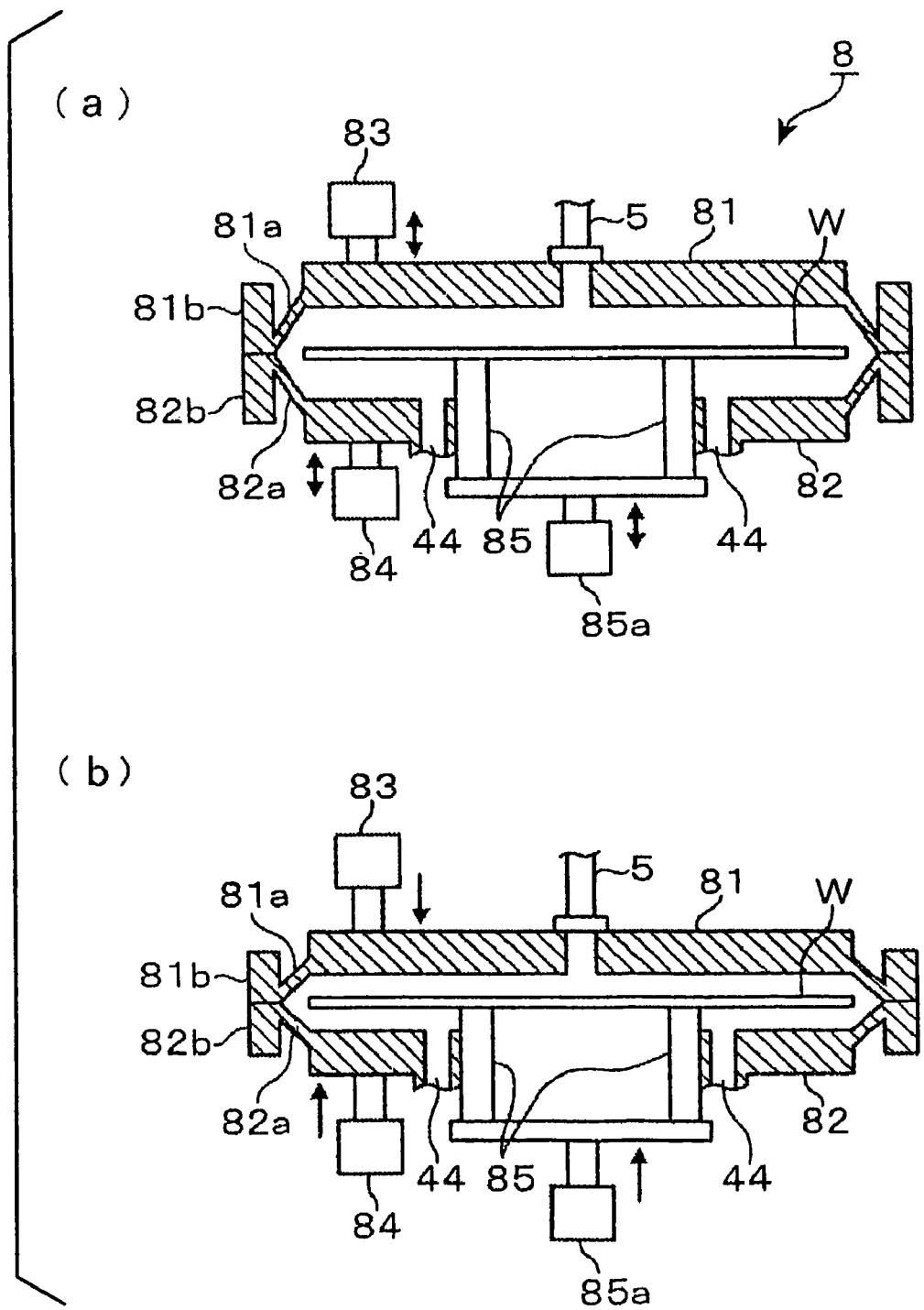
FIG. 19 is a schematic cross-sectional view illustrating a twelfth variation of the cleaning apparatus.

The configuration shown in FIG. 19 allows the gaps between the airtight container and the front and back surfaces of the wafer W to be changed. Specifically, the airtight container 8 is made up of an upper portion and a lower portion that include a top plate 81 and a bottom plate 82, respectively. The peripheral edge portions of the top and bottom plates 81 and 82 are connected to side wall portions 81b and 82b through flexible members 81a and 82a, respectively. The top and bottom plates 81 and 82 can be raised and lowered by lifting mechanisms 83 and 84, respectively. Reference numeral 85 denotes a vacuum chuck that also can be raised and lowered by a lifting mechanism 85a.

Raising and lowering the top and bottom plates 81 and 82 by use of the lifting mechanisms 83 and 84 bends and unbends the flexible members 81a and 82a, which allows the gaps between the airtight container 8 and the front and back surfaces of the wafer W to be adjusted within a predetermined range, for example, 0.5 mm to 5 mm while maintaining the hermetic seal of the airtight container 8. The fluid discharge portion 44 is formed in the bottom plate 82 around the vacuum chuck 85, like the embodiment shown in FIG. 3.

In the cleaning apparatus shown in FIG. 19, after the vacuum chuck 85 holds a wafer W by suction and the upper and lower portions of the airtight container 8 are brought into close contact with each other, the gaps between the airtight container 8 and the front and back surfaces of the wafer W are adjusted to a predetermined value by use of the lifting mechanisms 83, 84, and 85a. Thereafter, a cleaning liquid and a dry gas are sequentially supplied into the airtight container 8 to clean and dry the front and back surfaces of the wafer W in the same way as described in connection with the foregoing embodiments.

The configuration shown in FIG. 19 allows the size of the gaps to be changed depending on the case where the cleaning liquid or the dry gas is supplied. Furthermore, the size of the gaps can be changed depending on the resist material. That is, the gap size can be optimized for each process to be performed, further increasing the cleaning and drying efficiency. Since different types of resists have different hydrophobic properties, it is advantageous that the gap between the back surface of the wafer W and the airtight container 8 is adjustable.

Figure 20:
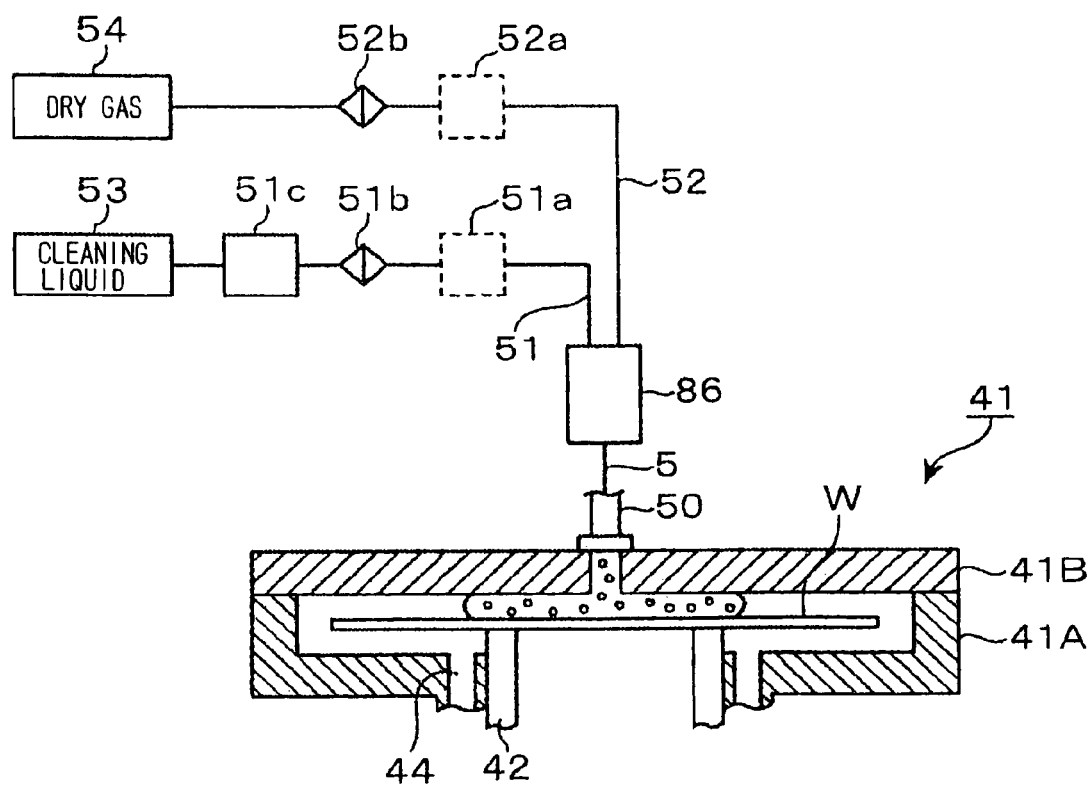
FIG. 20 is a schematic cross-sectional view illustrating a thirteenth variation of the cleaning apparatus.
Figure 21:
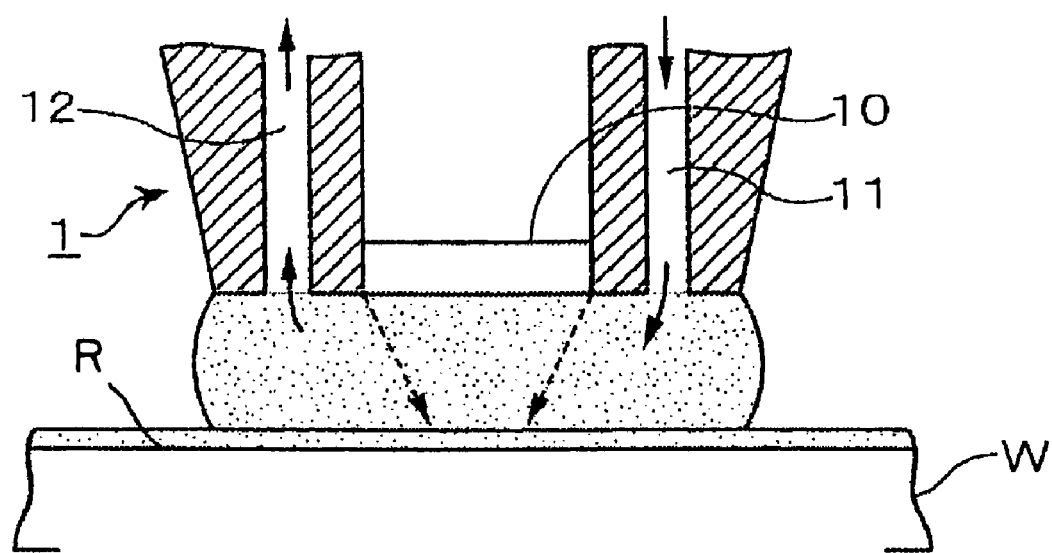
FIG. 21 is a cross-sectional view of a wafer and a portion adjacent to its surface, illustrating immersion exposure.
Figure 22:
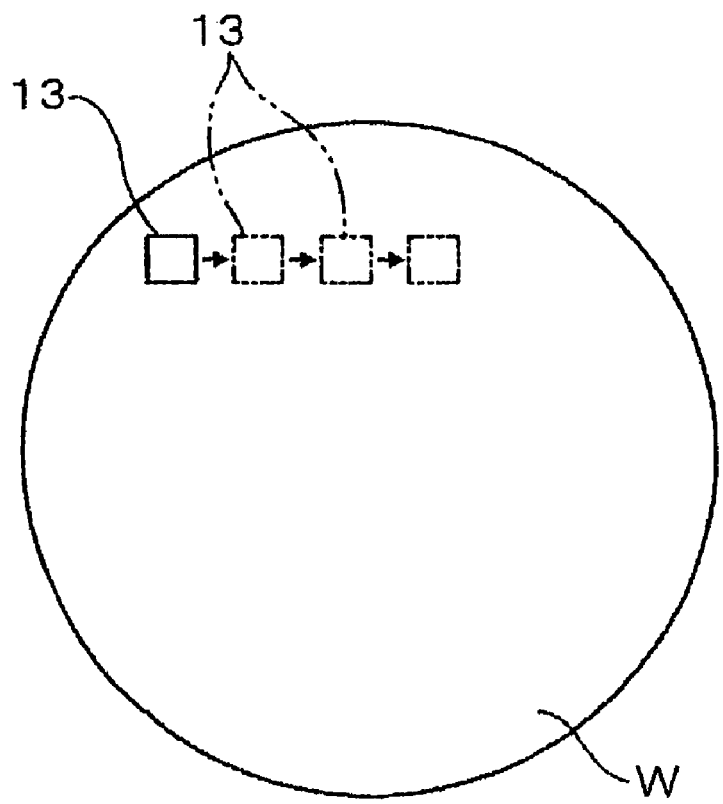
FIG. 22 is a plan view of the wafer, also illustrating immersion exposure.

In the cleaning apparatus shown in FIG. 20, the cleaning liquid supply path 51 and the dry gas supply path 52 are connected to a mixing chamber 86. With this arrangement, a cleaning liquid and a dry gas may be supplied to the mixing chamber 86 and then supplied to the wafer W through the fluid supply path 5 after they are mixed with each other in the mixing chamber 86. This achieves high cleaning effect in a certain type of process.

Note that a hydrophobizing treatment may be applied to all the inner surfaces of the airtight container 41 (or 8). In such a case, water droplets are prevented from attaching to the inner surfaces of the airtight container, enabling the dry gas to quickly dry the wafer W and the inner surfaces of the airtight container. The portions of the airtight container 41 (or 8) which is to be in contact with the cleaning liquid may be formed of a fluorocarbon resin to prevent dissolution of impurities into the cleaning liquid.

The cleaning apparatus of the present invention can be used not only to clean a wafer W that has been subjected to immersion exposure, but also to perform any substrate cleaning process. For example, the cleaning apparatus according to the present invention may be used to clean the surfaces and peripheral portion of a wafer after the resist liquid coating process and the heating (PAB) process and before the immersion exposure process. This makes it possible to remove particles from the wafer and thereby increase the exposure accuracy.

The invention claimed is:

1. A cleaning apparatus comprising:
a substrate holding unit that holds a circular substrate in a horizontal attitude;
an airtight container that accommodates the substrate such that a gap is formed between the airtight container and a front surface of the substrate held by the substrate holding unit and a gap is formed between the airtight container and at least a peripheral portion of a back surface of the substrate held by the substrate holding unit,
wherein hydrophilic regions having been subjected to a hydrophilizing treatment and hydrophobic regions having been subjected to a hydrophobizing treatment are formed in an inner surface of the airtight container, and
wherein the hydrophilic regions and the hydrophobic regions are formed along concentric circles having their common center located on a center axis of the substrate held by the substrate holding unit, and are arranged alternately with respect to a radial direction of the substrate;

a first cleaning liquid supply path, opening into an interior of the airtight container to face a center portion of the front surface of the substrate held by the substrate holding unit, that supplies a cleaning liquid toward the center portion of the front surface of the substrate;

a dry gas supply path through which a dry gas is supplied to the substrate held by the substrate holding unit after the substrate is supplied with the cleaning liquid; and a fluid discharge path, opening into the interior of the airtight container along a circle having its center located on an center axis of the substrate held by the substrate holding unit, that discharges the cleaning liquid from the airtight container, whereby the cleaning liquid supplied through the first cleaning liquid supply path into the airtight container flows and spreads from the center portion of the substrate to the peripheral portion of the substrate and exits through the fluid discharge path while such that the gaps between the airtight container and the surfaces of the substrate filled up with the cleaning liquid.

2. The cleaning apparatus as claimed in claim 1, wherein the fluid discharge path opens, at a bottom portion of the airtight container, into the interior of the airtight container along a circle having its center located on an center axis of the substrate held by the substrate holding unit.

3. The cleaning apparatus as claimed in claim 1, further comprising:

a second cleaning liquid supply path, opening into the interior of the airtight container to face the back surface of the substrate, that supplies a cleaning liquid toward the back surface of the substrate held by the substrate holding unit, wherein the fluid discharge path opens into the interior of the airtight container such that an opening or openings of the fluid discharge path surround a peripheral edge of the substrate held by the substrate holding unit;

whereby the cleaning liquid supplied through the first cleaning liquid supply path into the airtight container flows and spreads toward the peripheral portion of the substrate and exits the airtight container through the fluid discharge path while the gap between the front surface of the substrate and the airtight container is filled up with the cleaning liquid; and the cleaning liquid supplied through the second cleaning liquid supply path into the airtight container flows and spreads toward the peripheral portion of the substrate and exits the airtight container through the fluid discharge path while the gap between the back surface of the substrate and the airtight container is filled up with the cleaning liquid.

4. The cleaning apparatus as claimed in claim 1, wherein the substrate holding unit is a ring-shaped vacuum chuck that holds the substrate by suction while the substrate holding unit is in contact with a center portion of the back surface of the substrate.

5. The cleaning apparatus as claimed in claim 1, wherein a path used as the first cleaning liquid supply path is also used as the dry gas supply path.

6. The cleaning apparatus as claimed in claim 1, wherein a path used as the fluid discharge path is also used as the discharge path that discharges the dry gas.

7. The cleaning apparatus as claimed in claim 1, wherein a task of said apparatus is to clean the surfaces and the peripheral portion of the substrate after the substrate has been subjected to an immersion exposure process, which exposes a surface of the substrate having been coated with a resist liquid while a liquid layer is formed on the surface.

8. The cleaning apparatus as claimed in claim 1, wherein the fluid discharge path is provided in its midway thereof with a buffer chamber to equalize fluid discharge rate distribution with respect to a circumferential direction of the substrate.

9. The cleaning apparatus as claimed in claim 1, further comprising:

a cleaning liquid flow rate adjusting unit provided in the first cleaning liquid supply path;

a dry gas flow rate adjusting unit provided in the dry gas supply path; and a control unit configured to control the cleaning liquid flow rate adjusting unit and the dry gas flow rate adjusting unit such that: a cleaning liquid is supplied to the airtight container through the first cleaning liquid supply path at a first cleaning liquid flow rate; thereafter the cleaning liquid is supplied to the airtight container at a second cleaning liquid flow rate higher than the first cleaning liquid flow rate; thereafter, in place of the cleaning liquid, a dry gas is supplied to the airtight container through the dry gas supply path at a first dry gas flow rate; and thereafter the dry gas is supplied to the airtight container at a second dry gas flow rate higher than the first dry gas flow rate.

10. The cleaning apparatus as claimed in claim 1, further comprising:

a supplementary cleaning liquid supply portion that supplies a cleaning liquid to at least one of a peripheral portion of the front surface of the substrate held by the substrate holding unit and a peripheral portion the back surface of the substrate held by the substrate holding unit, wherein the supplementary cleaning liquid supply portion is arranged along a circle having its center located on a center axis of the substrate held by the substrate holding unit.

11. The cleaning apparatus as claimed in claim 1, wherein the gaps between the airtight container and the substrate held by the substrate holding unit are not less than 1 mm but not more than 5 mm.

12. A coating-and-developing apparatus comprising a carrier mounting section, a processing section, and an interface section connectable to an exposure apparatus, wherein the coating-and-developing apparatus is configured to: transfer a substrate, carried into the carrier mounting section by use of a carrier, to the processing apparatus; form a resist film on the substrate in the processing section; transfer the substrate to the exposure apparatus through the interface section; develop the substrate, which has been exposed and returned to the processing section through interface section, in the processing section; and transfer the substrate to the carrier mounting section, said coating-and-developing apparatus further comprising:

a cleaning apparatus incorporated in the processing section or the interface section to clean the substrate after exposure or before exposure, the cleaning apparatus including:

a substrate holding unit that holds a circular substrate in a horizontal attitude;

an airtight container that accommodates the substrate such that a gap is formed between the airtight container and a front surface of the substrate held by the substrate holding unit and a gap is formed between the airtight container and at least a peripheral portion of a back surface of the substrate held by the substrate holding unit, wherein hydrophilic regions having been subjected to a hydrophilizing treatment and hydrophobic regions having been subjected to a hydrophobizing treatment are formed in an inner surface of the airtight container, and wherein the hydrophilic regions and the hydrophobic regions are formed along concentric circles having their common center located on a center axis of the substrate held by the substrate holding unit, and are arranged alternately with respect to a radial direction of the substrate;

a first cleaning liquid supply path, opening into an interior of the airtight container to face a center portion of the front surface of the substrate held by the substrate holding unit, that supplies a cleaning liquid toward the center portion of the front surface of the substrate;

a dry gas supply path through which a dry gas is supplied to the substrate held by the substrate holding unit after the substrate is supplied with the cleaning liquid; and a fluid discharge path, opening into the interior of the airtight container along a circle having its center located on an center axis of the substrate held by the substrate holding unit, that discharges the cleaning liquid from the airtight container, whereby the cleaning liquid supplied through the first cleaning liquid supply path into the airtight container flows and spreads from the center portion of the substrate to the peripheral portion of the substrate and exits through the fluid discharge path such that the gaps between the airtight container and the surfaces of the substrate filled up with the cleaning liquid.

13. The cleaning apparatus as claimed in claim 1, further comprising:

an adjusting unit provided in the first cleaning liquid supply path; and a control unit that controls the adjusting unit to provide a flow rate of the cleaning liquid into the airtight container sufficient to fill the gaps between the airtight container and the surfaces of the substrate.

14. The coating-and-developing apparatus as claimed in claim 12, further comprising:

an adjusting unit provided in the first cleaning liquid supply path; and a control unit that controls the adjusting unit to provide a flow rate of the cleaning liquid into the airtight container sufficient to fill the gaps between the airtight container and the surfaces of the substrate.

15. The cleaning apparatus as claimed in claim 1, wherein a minimum width of the gaps is from 1 mm to 5 mm.

16. The coating-and-developing apparatus as claimed in claim 12, wherein a minimum width of the gaps is from 1 mm to 5 mm.

17. The cleaning apparatus as claimed in claim 1, wherein the first cleaning liquid supply path extends through an upper wall of the airtight container and opens into the interior of the airtight container at the lower surface, facing the front surface of the substrate, of the upper wall.

18. The coating-and-developing apparatus as claimed in claim 12, wherein the first cleaning liquid supply path extends through an upper wall of the airtight container and opens into the interior of the airtight container at the lower surface, facing the front surface of the substrate, of the upper wall.

* * * * *